United States Patent
Kim

(10) Patent No.: US 8,426,943 B2
(45) Date of Patent: Apr. 23, 2013

(54) SEMICONDUCTOR DEVICE HAVING E-FUSE STRUCTURE AND METHOD OF FABRICATING THE SAME

(75) Inventor: Deok-Kee Kim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 134 days.

(21) Appl. No.: 13/094,045

(22) Filed: Apr. 26, 2011

(65) Prior Publication Data

US 2011/0272764 A1    Nov. 10, 2011

(30) Foreign Application Priority Data

May 4, 2010    (KR) .................. 10-2010-0042075

(51) Int. Cl.
*H01L 23/52*    (2006.01)

(52) U.S. Cl.
USPC .................. 257/529; 257/209; 257/E23.149

(58) Field of Classification Search .................. 257/209, 257/529, E23.149

See application file for complete search history.

(56) References Cited

U.S. PATENT DOCUMENTS 5,904,507 A    5/1999    Thomas
6,121,074 A    9/2000    Prein

FOREIGN PATENT DOCUMENTS

EP    0 454 051 A2    10/1991
KR    10-2008-0076618 A    8/2008

*Primary Examiner* — Tan N Tran
(74) *Attorney, Agent, or Firm* — Harness, Dickey & Pierce, P.L.C.

(57) ABSTRACT

A semiconductor device includes: an e-fuse gate, a floating pattern between the e-fuse gate and an e-fuse active portion, a blocking dielectric pattern between the floating pattern and the e-fuse gate, and an e-fuse dielectric layer between the floating pattern and the e-fuse active portion. The floating pattern includes a first portion between the e-fuse gate and the e-fuse active portion and a pair of second portions extended upward along both sidewalls of the e-fuse gate from both edges of the first portion.

17 Claims, 19 Drawing Sheets

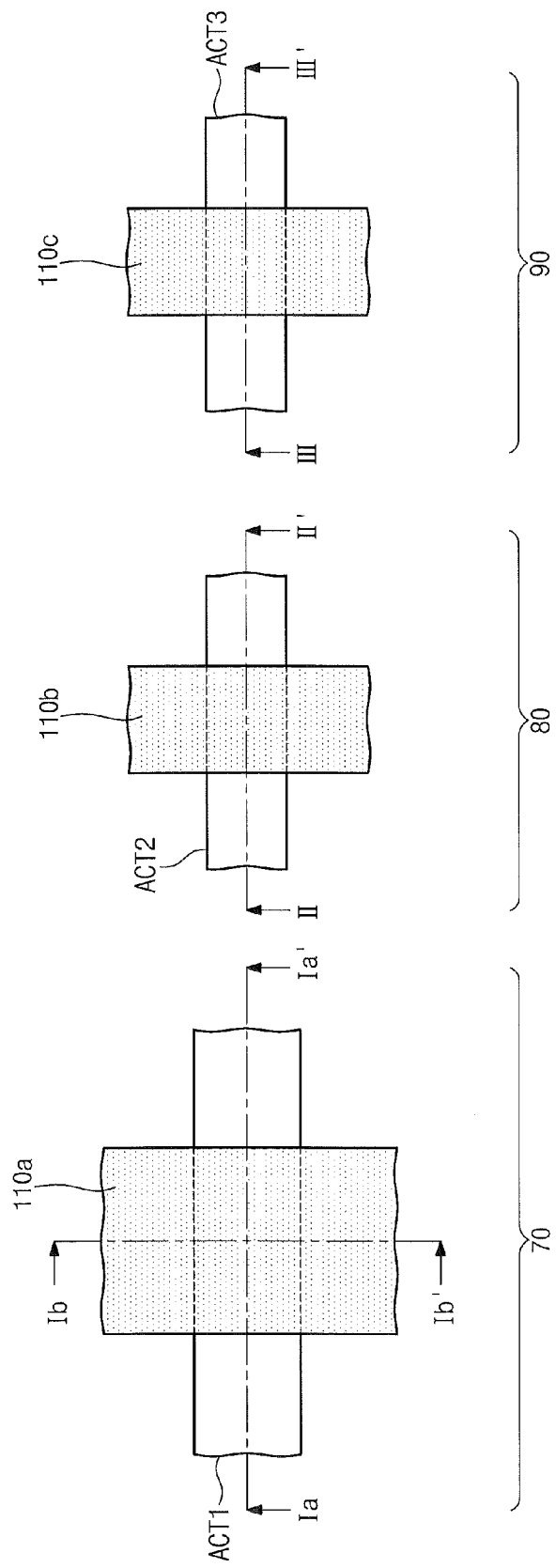

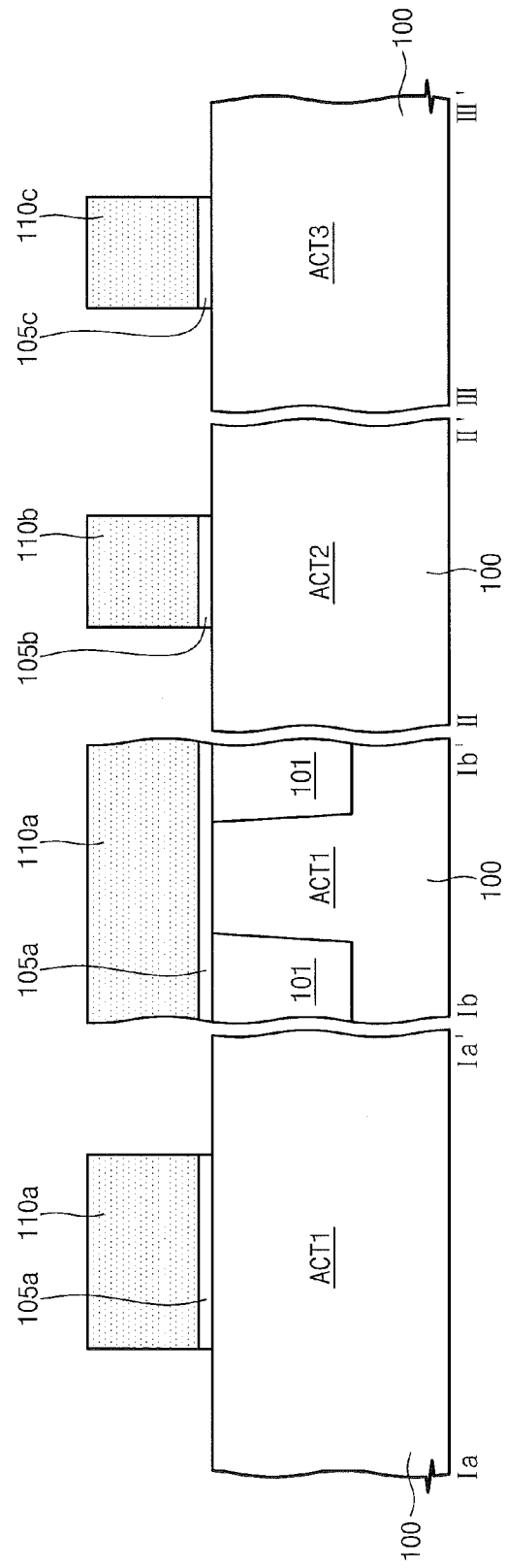

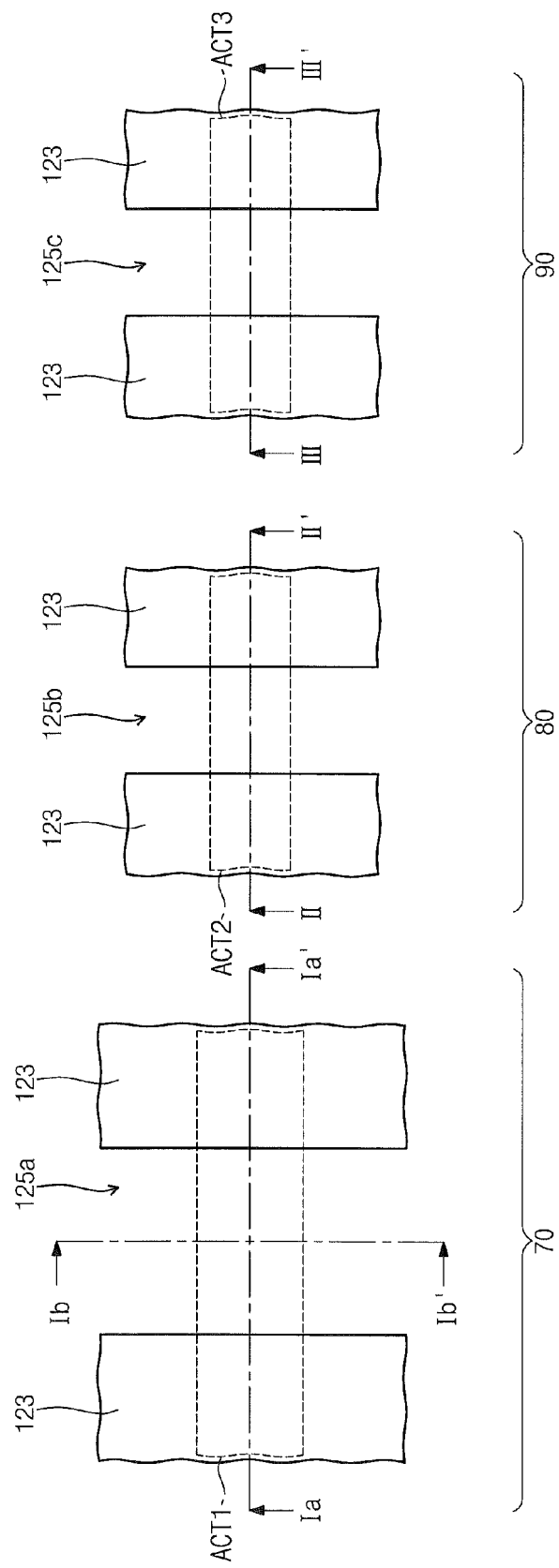

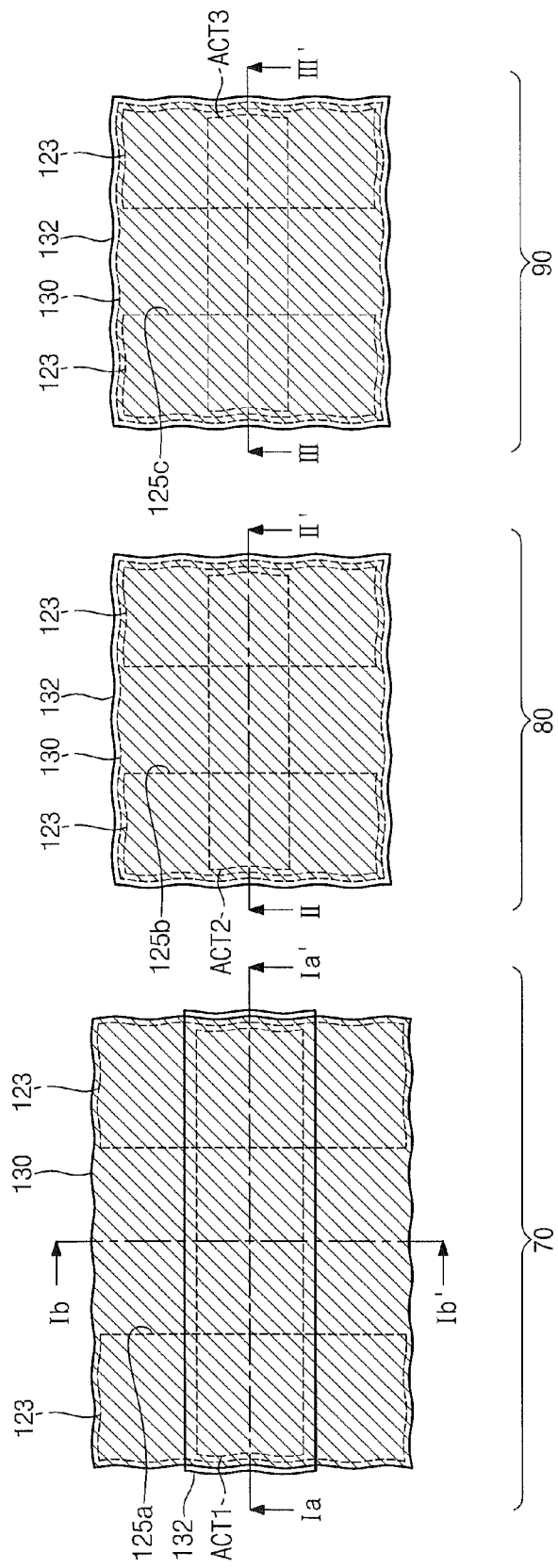

SEMICONDUCTOR DEVICE HAVING E-FUSE STRUCTURE AND METHOD OF FABRICATING THE SAME

CROSS-REFERENCE TO RELATED APPLICATION(S)

This non-provisional U.S. patent application claims priority under 35 U.S.C. §119 to Korean Patent Application No. 10-2010-0042075, filed on May 4, 2010, the entire contents of which are incorporated herein by reference.

BACKGROUND

1. Field

Example embodiments relate to semiconductor devices and methods of fabricating the same.

2. Brief Description of Conventional Art

Semiconductor devices have been identified as a relatively important factor in the electronics industry because of their relatively small size, multifunctionality, and relatively low manufacturing costs. Semiconductor devices may serve as storage devices for storing logic data or as logic devices for processing logic data.

Some conventional semiconductor devices include a fuse structure capable of performing various functions. However, fabricating and/or programming conventional fuse structures is relatively difficult.

Moreover, as the electronics industry becomes more highly developed, semiconductor devices including fuse structures may require increased integration, and requirements for fuse structures may become more widely varied.

SUMMARY

Example embodiments relate to semiconductor devices including e-fuse structures and methods of fabricating the same.

At least some example embodiments provide semiconductor devices including e-fuse structures capable of increasing integration, and methods of fabricating the same.

At least some example embodiments also provide semiconductor devices including e-fuse structures capable of improving program efficiency, and methods for fabricating the same.

At least one example embodiment of inventive concepts provides a semiconductor device including: an e-fuse gate crossing over an e-fuse active portion defined in a substrate; a floating pattern including a first portion between the e-fuse gate and the e-fuse active portion, and at least a pair of second portions extending upward along sidewalls of the e-fuse gate from both edges of the first portion; a blocking dielectric pattern between the floating pattern and the e-fuse gate; and an e-fuse dielectric layer between the floating pattern and the e-fuse active portion.

According to at least some example embodiments, the floating pattern may include a metallic conductive material having a work function different from that of the e-fuse gate.

Top surfaces of the second portions of the floating pattern may be coplanar or substantially coplanar with a top surface of the e-fuse gate. Alternatively, top surfaces of the second portions of the floating pattern may be disposed at a height lower than a top surface of the e-fuse gate.

The substrate may have a first region, a second region, and a third region that are separated from one another. The e-fuse active portion may be defined in the first region. In this example, the semiconductor device may further include: a first MOS gate dielectric layer and a first MOS gate sequentially stacked on a first MOS active portion defined in the second region of the substrate; and a second MOS gate dielectric layer and a second MOS gate sequentially stacked on a second MOS active portion defined in the third region of the substrate. A work function of the first MOS gate may be different from that of the second MOS gate.

The first MOS gate may include a first sub-gate, a second sub-gate and a third sub-gate that are sequentially stacked. The work function of the first MOS gate may be a first coupling-work function generated by coupling the first, second and third sub-gates of the first MOS gate. The second MOS gate may include a first sub-gate and a second sub-gate that are sequentially stacked. The work function of the second MOS gate may be a second coupling-work function generated by coupling of the first and second sub-gates of the second MOS gate.

The first sub-gate of the first MOS gate may have a work function different from the second coupling-work function, the floating pattern may have the same or substantially the same work function as that of the first sub-gate of the first MOS gate, and a work function of the e-fuse gate may be the same or substantially the same as the second coupling-work function.

The e-fuse gate may include a first sub-gate and a second sub-gate. The first sub-gate of the e-fuse gate, the first and second sub-gates of the first MOS gate, and the first sub-gate of the second MOS gate may serve as diffusion barriers with respect to corresponding metal elements.

The floating pattern may be formed of the same or substantially the same material as the first sub-gate of the first MOS gate. The second sub-gate of the first MOS gate may be formed of the same or substantially the same material as that of the first sub-gate of the second MOS gate. The third sub-gate of the first MOS gate may be formed of the same or substantially the same material as the second sub-gates of the second MOS gate. The e-fuse gate may be formed of the same or substantially the same material as the second MOS gate.

The first sub-gate of the first MOS gate may be thicker than the first sub-gate of the second MOS gate.

The first and second sub-gates of the first MOS gate may cover a bottom surface and sidewalls of the third sub-gate of the first MOS gate. The first sub-gate of the second MOS gate may cover a bottom surface and sidewalls of the second sub-gate of the second MOS gate.

According to at least some example embodiments, a semiconductor device may further include a mold layer disposed on the substrate. In this example, the e-fuse gate, the blocking dielectric pattern and the floating pattern may be disposed in a first groove defined in a portion of the mold layer corresponding to the first region. The first MOS gate may be disposed in a second groove defined in a portion of the mold layer corresponding to the second region. The second MOS gate may be disposed in a third groove defined in portion of the mold layer corresponding to the third region.

According to at least some example embodiments, the semiconductor device may further include: a first insulation spacer between the second portion of the floating pattern and the mold layer; a second insulation spacer between the sidewall of the first MOS gate and the mold layer; and a third insulation spacer between the sidewall of the second MOS gate and the mold layer. An inner sidewall of the first groove, an inner sidewall of the second groove, and an inner sidewall of the third groove may be defined by the first insulation spacer, the second insulation spacer, and the third insulation spacer, respectively. A horizontal distance between outer sidewalls of the pair of the second portions of the floating pattern may be larger than a width of the first MOS gate.

According to at least some example embodiments, the semiconductor device may further include: an e-fuse source/drain formed in the e-fuse active portion at sides of the floating pattern; a first MOS source/drain formed in the first MOS active portion at sides of the first MOS gate; and a second MOS source/drain formed in the second MOS active portion at sides of the second MOS gate. One of the first MOS source/drain and the second MOS source/drain may be doped with an N-type dopant, whereas the other may be doped with a P-type dopant. The e-fuse source/drain may be doped with the same type of dopant as that of one of the first MOS source/drain and the second MOS source/drain.

The e-fuse dielectric layer may include a high-k dielectric material having a dielectric constant higher than that of a silicon oxide layer.

At least one other example embodiment provides a method of fabricating a semiconductor device including: defining an e-fuse active portion by forming a device isolation pattern on a substrate; forming a mold layer on the substrate, the mold layer including a first groove crossing the e-fuse active portion; sequentially stacking a floating pattern, a blocking dielectric pattern, and an e-fuse gate in the first groove; and forming an e-fuse dielectric layer between the e-fuse active portion and the floating pattern. The floating pattern includes a first portion formed on the e-fuse active portion and at least a pair of second portions extending upward along sidewalls of the e-fuse gate from edges of the first portion.

According to at least some example embodiments, the substrate may include a first region, a second region, and a third region separated from each other. The first groove may be disposed in the first region, and the device isolation pattern may further define a first MOS active portion in the second region and a second MOS active portion in the third region. The mold layer may further include a second groove in the second region and a third groove in the third region. In this example, the method may further include: forming a first MOS gate in the second groove; forming a first MOS gate dielectric layer between the first MOS gate and the first MOS active portion; forming a second MOS gate in the third groove; and forming a second MOS gate dielectric layer between the second MOS gate and the second MOS active portion.

According to at least some example embodiments, the forming of the first, second and third grooves may include: sequentially stacking an e-fuse dielectric layer and a first dummy gate on the e-fuse active portion; sequentially stacking a first MOS gate dielectric layer and a second dummy gate on the first MOS active portion; sequentially stacking a second MOS gate dielectric layer and a third dummy gate on the second MOS active portion; forming a mold layer over the substrate; planarizing the mold layer to expose the first, second and third dummy gates; and forming the first, second and third grooves by removing the first to third dummy gates.

According to at least some example embodiments, prior to forming the mold layer, an e-fuse source/drain may be formed in the e-fuse active portion at each side of the first dummy gate; a first MOS source/drain may be formed in the first MOS active portion at each side of the second dummy gate; and a second MOS source/drain may be formed in the second MOS active portion at each side of the third dummy gate.

According to at least some example embodiments, prior to forming the mold layer, a first insulation spacer may be formed on sidewalls of the first dummy gate, a second insulation spacer may be formed on sidewalls of the second dummy gate, and a third insulation spacer may be formed on sidewalls of the third dummy gate.

According to at least some example embodiments, the floating pattern, the blocking dielectric pattern, the e-fuse gate, the first MOS gate, and the second MOS gate may be formed by: forming (e.g., conformally forming) a first conductive layer on the substrate including the first, second and third grooves; removing portions of the first conductive layer such that the first conductive layer is disposed on an inner surface of the first groove on the e-fuse active portion; forming (e.g., conformally forming) a blocking dielectric layer on the substrate; removing the blocking dielectric layer and the first conductive layer in the third region; exposing the first conductive layer in the second region by removing the blocking dielectric layer in the second region; forming (e.g., conformally forming) a second conductive layer on the substrate, the blocking dielectric layer in the first region, the exposed first conductive layer in the second region, and an inner surface of the third groove; forming a third conductive layer filling the first, second and third grooves on the second conductive layer; and planarizing the third conductive layer, the second conductive layer, the blocking dielectric layer, and the first conductive layer to expose the mold layer.

According to at least some example embodiments, a first coupling-work function generated by coupling of the first, second and third conductive layers in the second region may be different from a second coupling-work function generated by coupling of the second and third conductive layers in the third region. The first conductive layer may be thicker than the second conductive layer. A work function of the first conductive layer may be different from a coupling-work function generated by coupling the second and third conductive layers.

Prior to planarizing, top surfaces of the second portions of the floating pattern may be recessed such that the top surfaces of the second portions are disposed at a height lower than a top surface of the e-fuse gate.

A width of the first groove may be larger than a width of the second groove.

At least one other example embodiment provides an e-fuse structure for a semiconductor device including: an e-fuse gate formed on an e-fuse active portion of a substrate; and a floating layer pattern formed between the e-fuse active portion of the substrate and the e-fuse gate. The floating layer pattern covers a lower surface and sidewalls of the e-fuse gate.

According to at least some example embodiments, a blocking dielectric pattern may be arranged between the floating layer pattern and the e-fuse gate; and an e-fuse dielectric layer may be arranged between the floating layer pattern and the e-fuse active portion of the substrate. An e-fuse dielectric layer may be formed between the floating layer pattern and the e-fuse active portion of the substrate. Spacers may be formed at the sidewalls of the floating layer pattern. An upper surface of portions of the floating layer pattern covering the sidewalls of the e-fuse gate may be substantially co-planar with an upper surface of the e-fuse gate. Alternatively, an upper surface of portions of the floating layer pattern covering the sidewalls of the e-fuse gate may be recessed relative to an upper surface of the e-fuse gate. Source and drain regions may be formed in the substrate at each side of the e-fuse active portion.

At least one other example embodiment provides an e-fuse structure for a semiconductor device. According to at least this example embodiment, the e-fuse structure includes: an e-fuse gate formed on an e-fuse active portion of a substrate; and a metallic conductive layer pattern formed between the e-fuse active portion of the substrate and the e-fuse gate. The metallic conductive layer pattern covers a lower surface and sidewalls of the e-fuse gate and is insulated from the e-fuse active portion and the e-fuse gate.

According to at least some example embodiments, a blocking dielectric pattern may be arranged between the metallic conductive layer pattern and the e-fuse gate; and an e-fuse dielectric layer may be arranged between the metallic conductive layer pattern and the e-fuse active portion of the substrate. An e-fuse dielectric layer may be formed between the metallic conductive layer pattern and the e-fuse active portion of the substrate. Spacers may be formed at the sidewalls of the metallic conductive layer pattern. An upper surface of portions of the metallic conductive layer pattern covering the sidewalls of the e-fuse gate may be substantially co-planar with an upper surface of the e-fuse gate. Alternatively, an upper surface of portions of the metallic conductive layer pattern covering the sidewalls of the e-fuse gate may be recessed relative to an upper surface of the e-fuse gate. Source and drain regions may be formed in the substrate at each side of the e-fuse active portion.

BRIEF DESCRIPTION OF THE DRAWINGS

The accompanying drawings are included to provide a further understanding of the example embodiments of inventive concepts, and are incorporated in and constitute a part of this specification. The drawings illustrate example embodiments and, together with the description, serve to explain principles of inventive concepts. In the drawings:

FIGS. 4A to 11A are planar views for explaining a method of fabricating a semiconductor device according to an example embodiment of inventive concepts; and FIGS. 4B to 11B are cross-sectional views along Ia-Ia', Ib-Ib', II-II', and III-III' shown in FIGS. 4A to 11A.

DETAILED DESCRIPTION

Figure 1:
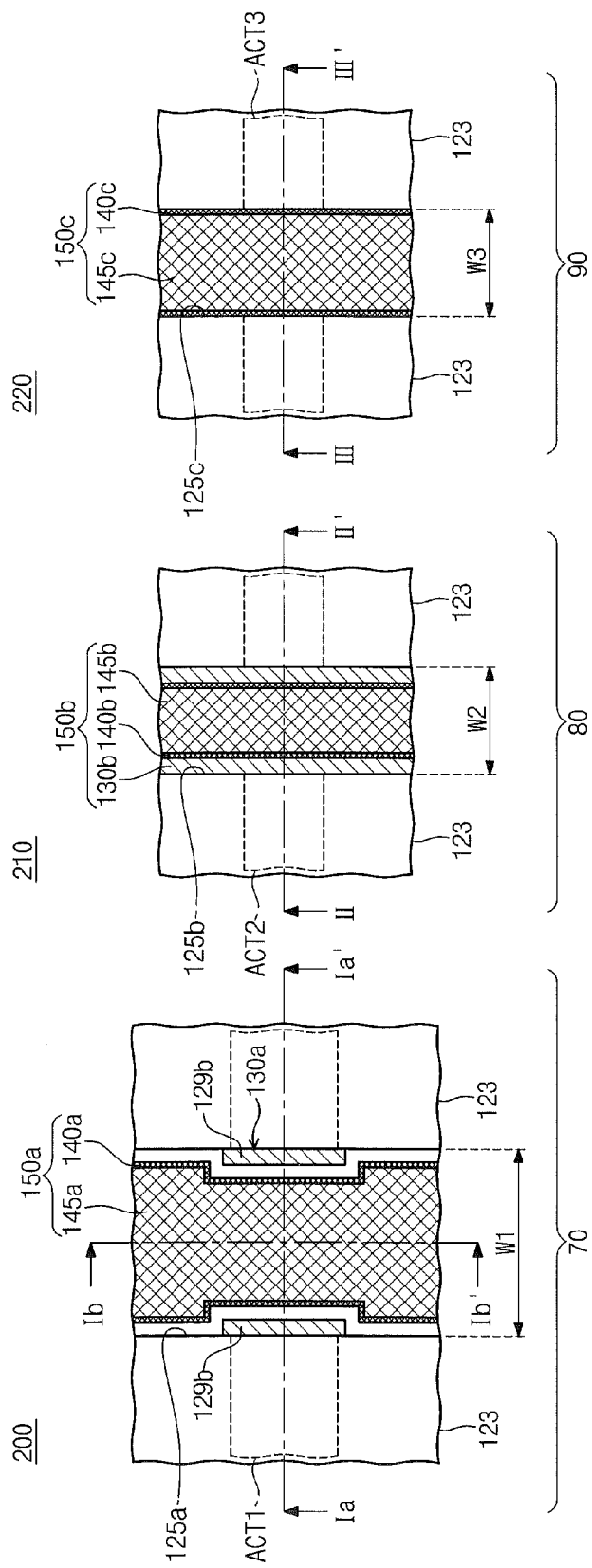
FIG. 1 is a planar view illustrating a semiconductor device according to an example embodiment of inventive concepts.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments of inventive concepts will be described in detail with reference to the accompanying drawings.

Figure 2:
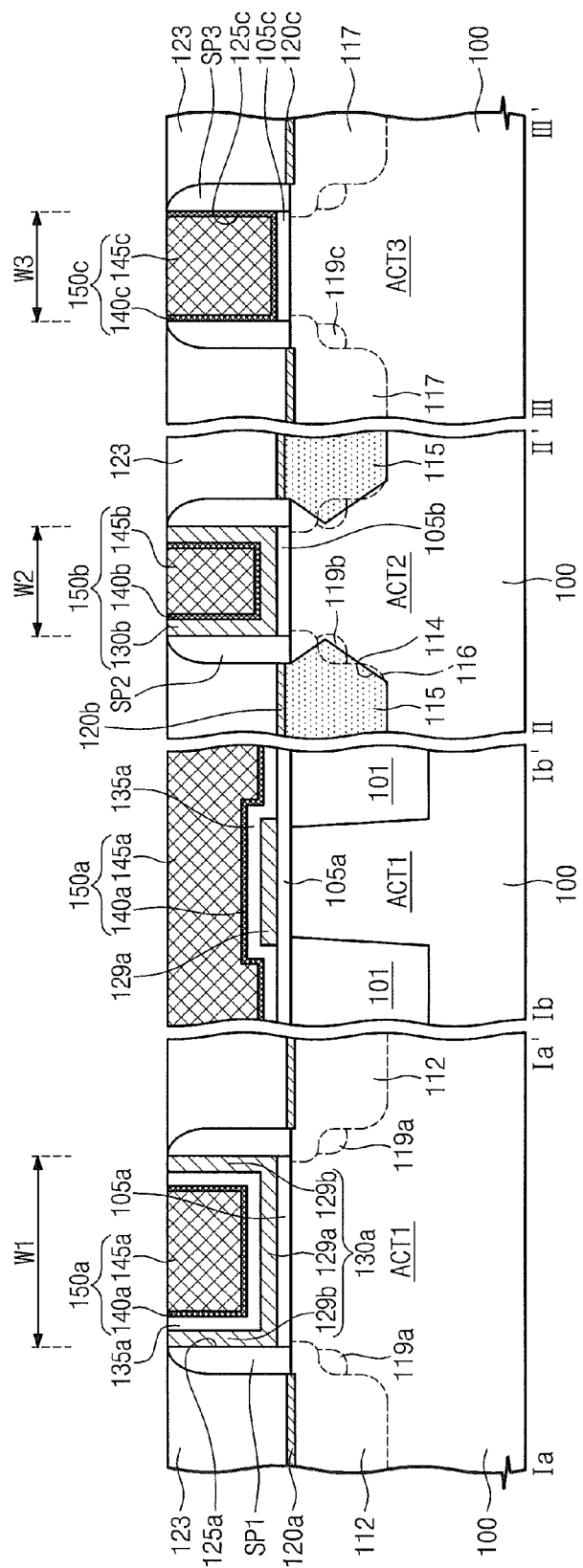
FIG. 2 is a cross-sectional view illustrating the semiconductor device of FIG. 1 sectioned along Ia-Ia', Ib-Ib', II-II', and III-III'.

FIG. 1 is a planar view illustrating a semiconductor device according to an example embodiment of inventive concepts. FIG. 2 is a cross-sectional view illustrating the semiconductor device of FIG. 1 sectioned along Ia-Ia', Ib-Ib', and III-III'.

Referring to FIGS. 1 and 2, a semiconductor substrate 100 (hereinafter, referred to as a substrate) includes a first region 70, a second region 80, and a third region 90 separated from each other. An e-fuse structure 200 is formed in/on the first region 70. A first Metal Oxide Semiconductor (MOS) transistor 210 is formed in/on the second region 80. A second MOS transistor 220 is formed in/on the third region 90. In this example, one of the first and second MOS transistors 210 and 220 is an NMOS transistor, whereas the other is PMOS transistor. According to at least one example embodiment, the substrate 100 may be a silicon substrate. However, inventive concepts are not limited to this example. The substrate 100 may be formed of other semiconductor materials.

Still referring to FIGS. 1 and 2, a device isolation pattern 101 defining active portions ACT1 to ACT3 is disposed on/in the substrate 100. In more detail, an e-fuse active portion ACT1 is defined in the first region 70, a first MOS active portion ACT2 is defined in the second region 80, and a second MOS active portion ACT3 is defined in the third region 90. In this example, the device isolation pattern 101 is a trench-type device isolation pattern filling a trench formed in the substrate 100. The device isolation pattern 101 may include an oxide, a nitride, an oxynitride, and/or an undoped semiconductor material. The active portions ACT1, ACT2 and ACT3 are portions of the substrate 100 surrounded by the device isolation pattern 101.

The first MOS active portion ACT2 may be doped with a first-type conductive dopant, whereas the second MOS active portion ACT3 may be doped with a second-type conductive dopant. In this example, one of the first and second-type conductive dopants is an N-type dopant and the other is a P-type dopant. The e-fuse active portion ACT1 may be doped with the first-type or second-type conductive dopant. In other words, the e-fuse active portion ACT1 may be doped with the same type of dopant as the first MOS active portion ACT2 or the second MOS active portion ACT3.

Still referring to FIGS. 1 and 2, an e-fuse gate 150a crosses over (e.g., formed perpendicular or substantially perpendicular to) the e-fuse active portion ACT1. A floating pattern 130a is disposed between the e-fuse gate 150a and the e-fuse active portion ACT1. In addition, the floating pattern 130a covers the sidewalls of the e-fuse gate 150a. In more detail, the floating pattern 130a includes a first portion 129a and at least a pair of second portions 129b. The first portion 129a of the floating pattern 130a is disposed between a low surface of the e-fuse gate 150a and an upper surface of the e-fuse active portion ACT1. The pair of second portions 129b extend upward along the sidewalls of the e-fuse gate 150a from edges of the first portion 129a. In one example, a portion of the e-fuse gate 150a is disposed between the pair of second portions 129b on the e-fuse active portion ACT1. Each of the second portions 129b of the floating pattern 130a includes an inner sidewall formed on the sidewall of the e-fuse gate 150a and an outer sidewall opposite to the inner sidewall. According to at least this example embodiment, a top surface of each of the second portions 129b is coplanar or substantially coplanar with a top surface of the e-fuse gate 150a.

The e-fuse gate 150a includes a first sub-gate 140a and a second sub-gate 145a that are stacked sequentially. The second sub-gate 145a of the e-fuse gate 150a includes a metal having relatively low resistivity. The first sub-gate 140a of the e-fuse gate 150a includes a conductive material different from that of the second sub-gate 145a. In one example, the first sub-gate 140a of the e-fuse gate 150a serves as a diffusion barrier for suppressing and/or preventing metal elements of the second sub-gate 145a from being diffused to the outside. The first sub-gate 140a may include a conductive metal nitride, and may have a single-layer or multi-layer structure. The first sub-gate 140a contacts a bottom surface of the second sub-gate 145a, and extends to contact the sidewalls of the second sub-gate 145a. Top surfaces of portions of the first sub-gate 140a contacting the sidewalls of the second sub-gate 145a are coplanar or substantially coplanar with a top surface of the second sub-gate 145a.

As illustrated in FIG. 2, an e-fuse dielectric layer 105a is disposed between the floating pattern 130a and the e-fuse active portion ACT1. In more detail, the e-fuse dielectric layer 105a is disposed between a lower surface of the first portion 129a of the floating pattern 130a and the top surface of the e-fuse active portion ACT1. A blocking dielectric pattern 135a is disposed between the e-fuse gate 150a and the floating pattern 130a. In more detail, the blocking dielectric pattern 135a is disposed between a bottom surface of the e-fuse gate 150a and a top surface of the first portion 129a of the floating pattern 130a, and between the sidewalls of the e-fuse gate 150a and the second portions 129b of the floating pattern 130a. The floating pattern 130a is insulated from the e-fuse active portion ACT1 by the e-fuse dielectric layer 105a, and the floating pattern 130a is insulated from the e-fuse gate 150a by the blocking dielectric pattern 135a. Accordingly, in this example, the floating pattern 130a floats.

According to at least one example embodiment, the floating pattern 130a includes a first metallic conductive material having a work function different from that of the e-fuse gate 150a. The first metallic conductive material may have a single-layer or multi-layer structure. According to at least this example embodiment, the first metallic conductive material may include a metal nitride or similar material. As described above, if the e-fuse gate 150a includes the first and second sub-gates 140a and 145a, then the work function of the e-fuse gate 150a corresponds to a coupling-work function generated by coupling the first and second sub-gates 140a and 145a. A work function of the first sub-gate 140a of the e-fuse gate 150a may be different from that of the second sub-gate 145a, and the coupling-work function of the e-fuse gate 150a may have a value between the work function of the first sub-gate 140a and the work function of the second sub-gate 145a.

The coupling-work function of the e-fuse gate 150a may be determined by the work function of the first sub-gate 140a, a thickness of the first sub-gate 140a, and/or the work function of the second sub-gate 145a. For example, if the thickness of the first sub-gate 140a is relatively thin (e.g., between about 5 Å and about 50 Å, inclusive), the coupling-work function of the e-fuse gate 150a may approximate to the work function of the second sub-gate 145a. On the contrary, if the thickness of the first sub-gate 140a is relatively thick (e.g., between about 100 Å and about 300 Å, inclusive), the coupling-work function of the e-fuse gate 150a may approximate to the work function of the first sub-gate 140a. More generally, for example, if the thickness of the first sub-gate 140a is relatively thin, then the work function of the second sub-gate 145a may dominate the coupling-work function of the e-fuse gate 150a. By contrast, if the thickness of the first sub-gate 140a is relatively thick, the work function of the first sub-gate 140a may dominate the coupling-work function of the e-fuse gate 150a. Accordingly, to make the work functions of the floating pattern 130a and the e-fuse gate 150 different from each other, the first sub-gate 140a is formed relatively thin and the second sub-gate 145a includes a metal having a work function different from that of the floating pattern 130a. Otherwise, the first sub-gate 140a is formed relatively thick and the first sub-gate 140a includes a second metallic conductive material having a work function different from that of the floating pattern 130a. The second metallic conductive material may have a single-layer or multi-layer structure.

Still referring to FIGS. 1 and 2, an e-fuse source/drain 112 is formed in the e-fuse active portion ACT1 at either side of the e-fuse gate 150a. The e-fuse source/drain 112 may be doped with a different type of dopant from that of the e-fuse active portion ACT1. In this example, the e-fuse source/drain 112 is/are formed as a lightly doped drain (LDD) structure. A first metal-semiconductor compound layer 120a is disposed on a portion of the e-fuse source/drain 112. The first metal-semiconductor compound layer 120a is formed of a compound generated by reaction between metal and the e-fuse active portion ACT1. In one example, the first metal-semiconductor compound layer 120a may be a metal silicide such as a cobalt silicide, a nickel silicide, or a titanium silicide. The first metal-semiconductor compound layer 120a is separated from the floating pattern 130a.

The e-fuse structure 200 shown in FIGS. 1 and 2 includes the e-fuse gate 150a, the blocking dielectric pattern 135a, the floating pattern 130a, the e-fuse dielectric layer 105a, and the e-fuse source/drain 112. The e-fuse structure 200 also includes a channel region defined under or below the e-fuse gate 150a.

According to at least this example embodiment, a first pocket region 119a is disposed at one side of the e-fuse source/drain 112 in the e-fuse active portion ACT1 under the e-fuse gate 150a. The first pocket region 119a is doped with the same type of dopant as the e-fuse active portion ACT1. A dopant density of the first pocket region 119a may be higher than that of the e-fuse active portion ACT1 under the e-fuse gate 150a. The first pocket region 119a may improve punch characteristics between the e-fuse source/drain 112.

Referring still to FIGS. 1 and 2, a first MOS gate dielectric layer 105b and a first MOS gate 150b are sequentially stacked on the first MOS active portion ACT2. The first MOS gate 150b crosses the first MOS active portion ACT2. A first MOS source/drain 116 is disposed in the first MOS active portion ACT2 at sides of the first MOS gate 150b. The first MOS source/drain 116 is doped with a different type of dopant from that of the first MOS active portion ACT2. That is, for example, the first MOS source/drain 116 may be doped with the second conductive type of dopant. The first MOS transistor 210 includes the first MOS gate 150b, the first MOS gate dielectric layer 105b, and the first MOS source/drain 116.

The first MOS gate 150b includes a first sub-gate 130b, a second sub-gate 140b, and a third sub-gate 145b that are sequentially stacked. The third sub-gate 145b includes a metal having a relatively low resistivity. According to at least this example embodiment, at least one of the first and second sub-gates 130b and 140b of the first MOS gate 150b serves as a diffusion barrier for reducing and/or minimizing diffusion of metal elements of the third sub-gate 145b to the outside. The first and second sub-gates 130b and 140b of the first MOS gate 150b cover a bottom surface and sidewalls of the third sub-gate 145b of the first MOS gate 150b. The second sub-gate 140b of the first MOS gate 150b contacts the third sub-gate 145b of the first MOS gate 150b, and the first sub-gate 130b of the first MOS gate 150b contacts the second sub-gate 140b of the first MOS gate 150b. Top surfaces of portions of the first and second sub-gates 130b and 140b of the first MOS gate 150b covering the sidewalls of the third sub-gate 145b are coplanar or substantially coplanar with a top surface of the third sub-gate 145b. According to at least this example embodiment, the first sub-gate 130b of the first MOS gate 150b is thicker than the second sub-gate 140b.

According to at least this example embodiment, recess regions 114 are formed in the first MOS active portion ACT2 at either side of the first MOS gate 150b, and a semiconductor pattern 115 fills or substantially fills each recess region 114. Stress may be applied to a channel region under the first MOS gate 150b. The semiconductor pattern 115 may include a semiconductor element different from that of the substrate 100. Therefore, the semiconductor pattern 115 may apply the stress to the channel region under the first MOS gate 150b. The stress applied by the semiconductor pattern 115 may be a compressive force or a tensile force.

If the first MOS transistor 210 is a PMOS transistor, then the semiconductor pattern 115 may apply a compressive force to the channel region to improve mobility of carriers (holes) in a channel formed in the channel region. In this example, when the substrate is a silicon substrate and the semiconductor pattern 115 applies the compressive force to the channel region, the semiconductor pattern 115 may be formed of silicon-germanium and/or germanium.

Otherwise, if the first MOS transistor 210 is an NMOS transistor, then the semiconductor pattern 115 may apply the tensile force to the channel region to improve the mobility of carriers (electrons) in the channel formed in the channel region. In this example, when the substrate is a silicon substrate and the semiconductor pattern 115 applies the tensile force to the channel region, the semiconductor pattern 115 may be formed of silicon-carbon and/or carbon.

At least a portion of the semiconductor pattern 115 is included in the first MOS source/drain 116. Accordingly, at least a portion of the semiconductor pattern 115 may be doped with the second-type conductive dopant. According to at least this example embodiment, the entirety of the semiconductor pattern 115 may be doped with the second-type conductive dopant so as to be included in the first MOS source/drain 116. A second metal-semiconductor compound layer 120b is disposed on a portion of the first MOS source/drain 116. The second metal-semiconductor compound layer 120b is formed of a compound generated by a reaction between metal and the semiconductor pattern 115. In one example, if the semiconductor pattern 115 includes silicon-germanium, then the second metal-semiconductor compound layer 120b may include metal-germanium silicide. In another example, if the semiconductor pattern 115 includes silicon-carbon, then the second metal-semiconductor compound layer 120b may include metal-carbon silicide. The metal in the second metal-semiconductor compound layer 120b may be cobalt, nickel, titanium or the like. According to at least this example embodiment, the semiconductor pattern 115 may protrude higher than the top surface of the substrate 100 (e.g., the top surface of the first MOS active portion ACT2). In this example, a bottom surface of the second metal-semiconductor compound layer 120b may be disposed at a level higher than the top surface of the substrate 100.

Still referring to FIGS. 1 and 2, a second pocket region 119b is disposed at one side of the first MOS source/drain 116 in the first MOS active portion ACT2 under the first MOS gate 150b. The second pocket region 119b may be doped with the same type of dopant as the first MOS active portion ACT2. A dopant density of the second pocket region 119b may be higher than that of the first MOS active portion ACT2 under the first MOS gate 150b. The second pocket region 119b may improve punch characteristics between the first MOS source/drain 116.

Referring still to FIGS. 1 and 2, a second MOS gate dielectric layer 105c and a second MOS gate 150c are sequentially stacked on the second MOS active portion ACT3. The second MOS gate 150c crosses over the second MOS active portion ACT3. A second MOS source/drain 117 is disposed in the second MOS active portion ACT3 at either side of the second MOS gate 150c. The second MOS source/drain 117 is doped with a different type of dopant from that of the second MOS active portion ACT3. That is, the second MOS source/drain 117 may be doped with the first-type conductive dopant. The second MOS transistor 220 includes the second MOS gate 150c, the second MOS gate dielectric layer 105c, and the second MOS source/drain 117.

The second MOS gate 150c includes a first sub-gate 140c and a second sub-gate 145c that are stacked sequentially. The second sub-gate 145c of the second MOS gate 150c includes a metal having a relatively low resistivity. In this example, the first sub-gate 140c of the second MOS gate 150c serves as a diffusion barrier for suppressing and/or minimizing diffusion of metal elements of the second sub-gate 145c to the outside. The first sub-gate 140c of the second MOS gate 150c contacts a bottom surface and sidewalls of the second sub-gate 145c of the second MOS gate 150c. Top surfaces of portions of the first sub-gate 140c covering the sidewalls of the second sub-gate 145c are form coplanar or substantially coplanar with a top surface of the second sub-gate 145c.

Similar to the above-described first MOS transistor 210, a second semiconductor pattern (not illustrated) may be provided to apply stress to a channel region under the second MOS gate 150c. The second semiconductor pattern may fill a second recess region (not illustrated) formed in the second MOS active portion ACT3 at either side of the second MOS gate 150c. A third metal-semiconductor compound layer 120c may be disposed on a portion of the second MOS source/drain 117. The third metal-semiconductor compound layer 120c is separated from the second MOS gate 150c. For example, the third metal-semiconductor compound layer 120c may be cobalt silicide, nickel silicide, titanium silicide, cobalt-germanium silicide, nickel-germanium silicide, titanium-germanium silicide, cobalt-carbon silicide, nickel-carbon silicide, titanium-carbon silicide or the like.

According to at least this example embodiment, a third pocket region 119c is disposed at one side of the second MOS source/drain 117 in the second MOS active portion ACT3 under the second MOS gate 150c. The third pocket region 119c is doped with the same type of dopant as that of the second MOS active portion ACT3. A dopant density of the third pocket region 119c may be higher than that of the second MOS active portion ACT3 under the second MOS gate 150c. The third pocket region 119c may improve punch characteristics between the second MOS source/drain 117.

Still referring to FIGS. 1 and 2, as described above, one of the first and second MOS transistors 210 and 220 is a PMOS transistor, whereas the other is an NMOS transistor. A work function of the first MOS gate 150b may be different from that of the second MOS gate 150c.

According to at least this example embodiment, as described above, the first MOS gate 150b includes the first, second and third sub-gates 130b, 140b, and 145b that are sequentially stacked. In this case, the work function of the first MOS gate 150b may correspond to a first coupling-work function generated by coupling of the first to third gates 130b, 140b, and 145b of the first MOS gate 150b. Similarly, when the second MOS gate 150c includes the first and second sub-gates 140c and 145c that are sequentially stacked, the work function of the second MOS gate 150c may correspond to a second coupling-work function generated by coupling of the first and second sub-gates 140c and 145c.

The first coupling-work function may be determined according to the work function and/or thickness of the first sub-gate 130b, the work function and/or thickness of the second sub-gate 140b, and/or the work function of the third sub-gate 145b in the first MOS gate 150b. According to at least this example embodiment, the work function of the first sub-gate 130b of the first MOS gate 150b may dominate the first coupling-work function. In other words, for example, the first coupling-work function may approximate to the work function of the first sub-gate 130b of the first MOS gate 150b. The work function of the first sub-gate 130b of the first MOS gate 150b may dominate the first coupling-work function by making the first sub-gate 130b of the first MOS gate 150b thicker than the second sub-gate 140b. In this case, the work function of the first sub-gate 130b of the first MOS gate 150b may be different from the second coupling-work function.

The second coupling-work function may be determined according to the work function and/or thickness of the first sub-gate 140c and/or the work function of the second sub-gate 145c in the second MOS gate 150c. For example, if the thickness of the first sub-gate 140c of the second MOS gate 150c is relatively thin (e.g., from about 5 A to about 50 A), the second coupling-work function may approximate to the work function of the second sub-gate 145c among the work functions of the first and second sub-gates 140c and 145c. Otherwise, if the thickness of the first sub-gate 140c of the second MOS gate 150c is relatively thick (e.g., from about 100 Å to about 300 Å), the second coupling-work function may approximate to the work function of the first sub-gate 140c of the second MOS gate 150c. According to at least this example embodiment, the first sub-gate 140c of the second MOS gate 150c may be thinner than the first sub-gate 130b of the first MOS gate 150b, and the second sub-gate 145c of the second MOS gate 150c may dominate the second coupling-work function. That is, for example, the second coupling-work function may approximate to the work function of the second sub-gate 145c of the second MOS gate 150c.

According to at least this example embodiment, the floating pattern 130a of the e-fuse structure 200 may have the same or substantially the same work function as that of the first sub-gate 130b of the first MOS gate 150b. Also, the e-fuse gate 150a may have the same or substantially the same work function as that of the second MOS gate 150c. The floating pattern 130a may be formed of the same or substantially the same material as that of the first sub-gate 130b of the first MOS gate 150b. The e-fuse gate 150a may be formed of the same or substantially the same material as that of the second MOS gate 150c. In more detail, the first and second sub-gates 140a and 145a of the e-fuse gate 150a may be formed of the same or substantially the same materials as the first and second sub-gates 140c and 145c of the second MOS gate 150c respectively. The second and third sub-gates 140b and 145b of the first MOS gate 150b may be formed of the same or substantially the same materials as those of the first and second sub-gates 140c and 145c of the second MOS gate 150c, respectively.

An example in which the first MOS transistor 210 is a PMOS transistor and the second MOS transistor 220 is an NMOS transistor will be explained in more detail below. In this example, the work function of the first MOS gate 150b may be larger than the work function of the second MOS gate 150c. The first coupling-work function of the first MOS gate 150b may also be larger than the second coupling-work function of the second MOS gate 150c. As described above, because the first sub-gate 130b of the first MOS gate 150b has a sufficient thickness, the first sub-gate 130b of the first MOS gate 150b may dominate the first coupling-work function. In this case, the work function of the first sub-gate 130b of the first MOS gate 150b may approximate to an energy level of a valence band edge of semiconductor material composing the substrate 100. For example, if the substrate 100 is a silicon substrate, the work function of the first sub-gate 130b of the first MOS gate 150b may be between about 4.7 eV and about 5.4 eV, inclusive. In addition, the first sub-gate 130b of the first MOS gate 150b may serve as a diffusion barrier. Thus, the first sub-gate 130b of the first MOS gate 150b may include a relatively high work function-metal nitride having a work function that approximates to an energy level of a valence band edge of silicon. The relatively high work function-metal nitride may include at least one selected from tungsten nitride (WN), titanium nitride (TiN), molybdenum nitride (MoN), nitrogen-rich tantalum nitride (N-rich TaN), high temperature-tantalum nitride (TaN) or the like. The nitrogen-rich tantalum nitride may be tantalum nitride having nitrogen density higher than a stoichiometric content ratio of tantalum nitride. The high temperature-tantalum nitride may be tantalum nitride deposited under a relatively high temperature (e.g., from about 400° C. to about 700° C., inclusive). Additionally, the first sub-gate 130b of the first MOS gate 150b may further include a relatively thin glue layer under the relatively high work function-metal nitride. The glue layer may be thinner than the high work function-metal nitride. The glue layer may be titanium, tantalum or the like.

As described above, if the first MOS transistor 210 is a PMOS transistor and the second MOS transistor 220 is an NMOS transistor, the second coupling-work function of the second MOS gate 150c may approximate to an energy level of a valence band edge of semiconductor material composing the substrate 100. For example, if the substrate 100 is a silicon substrate, then second coupling-work function of the second MOS gate 150c may be between about 3.9 eV to about 4.4 eV, inclusive. As described above, according to at least this example embodiment, because the first sub-gate 140c of the second MOS gate 150c is thinner than the first sub-gate 130b of the first MOS gate 150b, the work function of the second sub-gate 145c of the second MOS gate 150c may dominate the second coupling-work function. In this case, the work function of the second sub-gate 145c of the second MOS gate 150c may be between about 3.9 eV to about 4.4 eV, inclusive. Also, the second sub-gate 145c of the second MOS gate 150c may have a lower resistivity than that of at least the first sub-gate 140c. In one example, the second sub-gate 145c of the second MOS gate 150c may include aluminum. As discussed herein, the first sub-gate 140c having a relatively thin thickness may include conductive metal nitride capable of serving as a diffusion barrier (e.g., titanium nitride (TiN), tantalum nitride (TaN), and/or tungsten nitride (WN)). In addition, the first sub-gate 140c of the second MOS gate 150c may further include a glue layer (e.g., titanium and tantalum) under the conductive metal nitride. Meanwhile, as described above, the third sub-gate 145b of the first MOS gate 150b may be formed of the same or substantially the same material as the second sub-gate 145c of the second MOS gate 150c. In this case, even though the first MOS gate 150b includes the third sub-gate 145b having a relatively low work function, the first coupling-work function of the first MOS gate 150b may be kept relatively high because the first sub-gate 130b of the first MOS gate 150b has a sufficient thickness.

According to at least this example embodiment, when the first sub-gate 140c of the second MOS gate 150c is sufficiently thick (e.g., between about 100 Å and about 300 Å, inclusive), the work function of the first sub-gate 140c of the second MOS gate 150c may dominate the second coupling-work function. In this case, the first sub-gate 140c of the second MOS gate 150c may include relatively low work function-metal nitride whose work function ranges from between about 3.9 eV and about 4.4 eV, inclusive. In one example, the relatively low work function-metal nitride may include low temperature-tantalum nitride, tantalum nitride having a stoichiometric content ratio, and/or nitrogen-deficient tantalum nitride. The low temperature-tantalum nitride refers tantalum nitride deposited under a relatively low temperature (e.g., between about 5° C. to about 380° C.). In addition, the first sub-gate 140c of the second MOS gate 150c may further include a glue layer (e.g., titanium or tantalum) under the low work function-metal nitride.

When the first MOS transistor 210 is a PMOS transistor and the second MOS transistor 220 is an NMOS transistor, the semiconductor pattern 115 in the first MOS active portion ACT2 may be formed of silicon-germanium and/or germanium so that a compressive force may be applied to the channel region of the first MOS transistor 210. As discussed herein, the second semiconductor pattern (not illustrated) formed of silicon-carbon and/or carbon may exist or may not exist in the second MOS active portion ACT3.

An example embodiment in which the first MOS transistor 210 is an NMOS transistor and the second MOS transistor 220 is a PMOS transistor will be explained in more detail below. In this example, the work function (or the first coupling-work function) of the first MOS gate 150b may be smaller than the work function (or the second coupling-work function) of the second MOS gate 150c. According to at least this example embodiment, the first sub-gate 130b of the first MOS gate 150b may include the above-mentioned relatively low work function-metal nitride (e.g., low temperature-tantalum nitride, tantalum nitride having a stoichiometric content ratio, and/or nitrogen-deficient tantalum nitride). In addition, the first sub-gate 130b of the first MOS gate 150b may further include a glue layer (e.g., titanium or tantalum) under the relatively low work function-metal nitride. If the first sub-gate 140c of the second MOS gate 150c is thinner than the first sub-gate 130b of the first MOS gate 150b, the second sub-gate 145c of the second MOS gate 150c may include metal (e.g., platinum (Pt), nickel (Ni), or palladium (Pd)) approximating an energy level of a valence band edge of silicon and the first subgate 140c may include conductive metal nitride (e.g., titanium nitride (TiN), tantalum nitride (TaN), and/or tungsten nitride (WN)) having characteristics of a diffusion barrier. Otherwise, if the first sub-gate 140c of the second MOS gate 150c has a sufficient thickness (e.g., from about 100 Å to about 300 Å), then the first sub-gate 140c of the second MOS gate 150c may include the above-mentioned relatively high work function-metal nitride (e.g., tungsten nitride (WN), titanium nitride (TiN), molybdenum nitride (MoN), nitrogen-rich tantalum nitride (N-rich TaN), and high temperature-tantalum nitride (TaN)).

Still referring to FIGS. 1 and 2, the e-fuse dielectric layer 105a may include high-k dielectric material (e.g., metal oxide such as hafnium oxide, aluminum oxide, and zirconium oxide) having a dielectric constant higher than that of silicon oxide. The e-fuse dielectric layer 105a may further include a lower buffer dielectric (e.g., oxide) between the high-k dielectric material and the e-fuse active portion ACT1. In addition, the e-fuse dielectric layer 105 may further include an upper buffer dielectric (e.g., oxide) between the high-k dielectric material and the floating pattern 130a. The blocking dielectric pattern 135a may include at least one selected from oxide, nitride, oxynitride, and/or high-k dielectric material (e.g., metal oxide such as hafnium oxide, aluminum oxide, and zirconium oxide).

The first MOS gate dielectric layer 105b may include high-k dielectric material (e.g., metal oxide such as hafnium oxide, aluminum oxide, and zirconium oxide) having a dielectric constant higher than that of silicon oxide. According to at least this example embodiment, the first MOS gate dielectric layer 105b may have a double-layer structure of lower buffer dielectric/high-k dielectric material or a triple-layer structure of lower buffer dielectric/high-k dielectric material/upper buffer dielectric. Similarly, the second MOS gate dielectric layer 105c may include high-k dielectric material (e.g., metal oxide such as hafnium oxide, aluminum oxide, and zirconium oxide) having a dielectric constant higher than that of silicon oxide. The second MOS gate dielectric layer 105c may have a double-layer structure of lower buffer dielectric/high-k dielectric material or a triple-layer structure of lower buffer dielectric/high-k dielectric material/upper buffer dielectric. The e-fuse dielectric layer 105a, the first MOS gate dielectric layer 105b, and the second MOS gate dielectric layer 105c may be formed of the same or substantially the same material or may include different high-k dielectric materials.

A mold layer 123 may be disposed over or on the substrate 100. The mold layer 123 may include a first groove 125a, a second groove 125b, and a third groove 125c. The first groove 125a may be defined in the mold layer 123 in the first region 70; the second groove 125b may be defined in the mold layer 123 in the second region 80; and the third groove 125c may be defined in the mold layer 123 in the third region 90. The floating pattern 130a and the e-fuse gate 150a may be disposed in the first groove 125a. Similarly, the first MOS gate 150b may be disposed in the second groove 125b, and the second MOS gate 150c may be disposed in the third groove 125c. According to at least this example embodiment, a top surface of the mold layer 123 may be coplanar or substantially coplanar with top surfaces of the e-fuse gate 150a and the first and second MOS gates 150b and 150c. Also, the top surface of the mold layer 123 may be coplanar or substantially coplanar with top surfaces of the second portions 129b of the floating pattern 130a.

A pair of first insulation spacers SP1 may be respectively disposed between the mold layer 123 and outside walls of the pair of second portions 129b of the floating pattern 130a. A pair of second insulation spacers SP2 may be respectively disposed between the sidewalls of the first MOS gate 150b and the mold layer 123. A pair of third insulation spacers SP3 may be respectively disposed between the sidewalls of the second MOS gate 150c and the mold layer 123. The inner sidewalls of the first groove 125a may be formed by the sidewalls of the pair of first insulation spacers SP1. Likewise, the inner sidewalls of the second groove 125b may be formed by the sidewalls of the pair of second insulation spacers SP2. The inner sidewalls of the third groove 125c may be &tined by the sidewalls of the pair of third insulation spacers SP3. The first, second and third metal-semiconductor compound layers 120a, 120b and 120c may be separated from the floating pattern 130a, the first MOS gate 150b, and the second MOS gate 150c by the first to third insulation spacers SP1, SP2 and SP3, respectively.

The first, second and third insulation spacers SP1, SP2 and SP3 may be formed of, for example, oxide, nitride, and/or oxynitride. According to at least some alternative example embodiments, the first, second and third insulation spacers SP1, SP2 and SP3 may be omitted. In this case, the inner sidewalls of the first, second and third grooves 125a, 125b and 125c may be formed of the mold layer 123.

Still referring to FIGS. 1 and 2, a horizontal distance between the outside walls of the pair of second portions 129b in the floating pattern 130a is defined as a first width W1. The first width W1 of the floating pattern 130a may be different from a second width W2 of the first MOS gate 150b and a third width W3 of the second MOS gate 150c. As shown in FIG. 2, the first width W1 may be larger than the second width W2. Likewise, the first width W1 may be larger than the third width W3. The second width W2 may be equal to, substantially equal to or different from the third width W3. However, inventive concepts are not limited thereto. The first width W1 may be the same or substantially the same as the second width W2 and/or the third width W3. The first width W1 may be the same or substantially the same as a width of the first groove 125a. Likewise, the second and third widths W2 and W3 may be the same or substantially the same as widths of the second and third grooves 125b and 125c, respectively.

In the above-described example embodiments, the e-fuse structure 200 has different threshold voltages according to whether charges are stored in the floating pattern 130a. For example, in a state where charges are stored in the floating pattern 130a, the e-fuse structure 200 has a first threshold voltage, whereas in a state where charges are not stored in the floating pattern 130a, the e-fuse structure 200 has a second threshold voltage. In this example, the first and second threshold voltages are different from each other. The e-fuse structure 200 may be turned on or off based on the difference between the first and second threshold voltages. The e-fuse structure 200 may be programmed by electrically supplying charges to the floating pattern 130a. A program voltage applied to the e-fuse gate 150a causes charges in the channel region under the e-fuse gate 150a to tunnel through the e-fuse dielectric layer 105a so as to be stored in the floating pattern 130a.

Because the e-fuse structure 200 is programmed by supplying charges into the floating pattern 130a, a size of the e-fuse structure 200 may be reduced. Therefore, semiconductor devices having e-fuse structures for increasing integration may be implemented. Also, e-fuse structures according to at least some example embodiments may be programmed by supplying the program voltage to the e-fuse gate 150a, thereby simplifying programming operations for the e-fuse structure 200. Also, relatively high-priced program equipment is not required. As a result, program efficiency of the e-fuse structure 200 may be increased.

Also, according to at least some example embodiments, the floating pattern 130a and the e-fuse gate 150a of the e-fuse structure 200 may be formed of the same or substantially the same material as portions of the MOS gates 150b and 150c of the first and second MOS transistors 210 and 220. Accordingly, the e-fuse structure 200 may be formed in parallel (e.g., simultaneously and/or concurrently) with the MOS transistors 210 and 220. As a result, additional processes for forming the e-fuse structure 200 may be suppressed and/or minimized, and semiconductor device productivity may be improved.

Additionally, by using a voltage difference between the e-fuse gate 150a and the e-fuse active portion ACT1, the charges in the floating pattern 130a may be released to the outside of the floating pattern 130a. Accordingly, in the event of a program error in the e-fuse structure 200, the e-fuse structure 200 may be reprogrammed thereby improving semiconductor device yield.

E-fuse structures according to at least some example embodiments may be used for various purposes. For example, an e-fuse structure 200 may be used as a chip identification component for recording information about fabrication histories of semiconductor chips. In this example, the e-fuse structure 200 may be arrayed and included in the chip identification component.

As another example, after completion of fabricating semiconductor chips, the e-fuse structure 200 may be included in a component for chip customization for improving and/or optimizing respective characteristics of the semiconductor chips. For example, controlling speeds of various signals for operating the semiconductor chips, controlling resistances of resistors in the semiconductor chips, and/or controlling capacitances of capacitors in the semiconductor chips may be performed according to whether the e-fuse structure 200 in the chip customization component is programmed so that characteristics of fabricated semiconductor chips may be improved and/or optimized.

When a semiconductor device including the e-fuse structure 200 is implemented as a semiconductor memory device, the e-fuse structure 200 may be used as a repair unit for replacing a defective memory cell with a redundant memory cell. Inventive concepts are not limited to the examples disclosed hereto. The e-fuse structure 200 may be used for other various purposes.

Further, each of the first and second MOS transistors 210 and 220 may include a gate having an appropriate work function for satisfying desired and/or required characteristics. Accordingly, each of the e-fuse structure 200, the first MOS transistor 210, and the second MOS transistor 220 may be implemented to have improved and/or optimized characteristics.

In semiconductor devices according to at least some example embodiments, the top surfaces of the second portions 129b of the floating pattern 130a may be coplanar or substantially coplanar with the top surface of the e-fuse gate 150a. Otherwise, the top surfaces of the second portions 129b may have a height different from the height of the top surface of the e-fuse gate 150a. This will be explained in more detail below with regard to FIG. 3.

Figure 3:
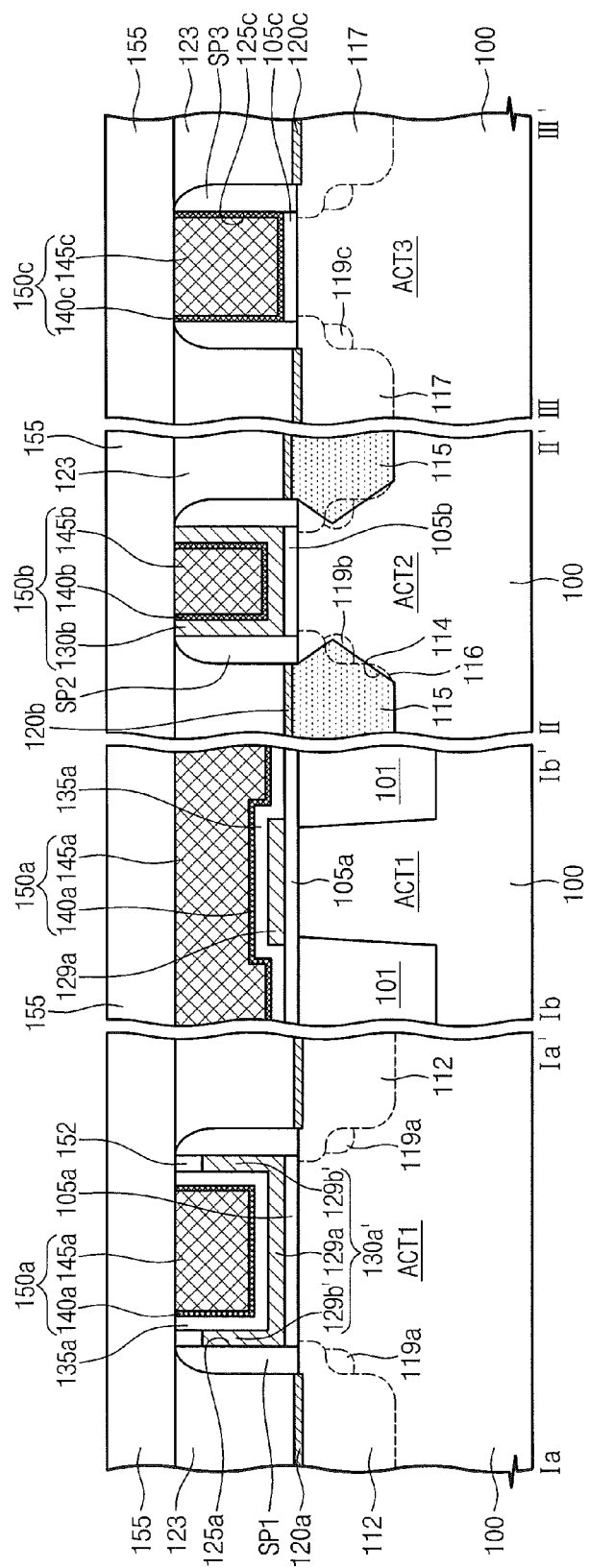
FIG. 3 is a cross-sectional view illustrating an example modification of the semiconductor device shown in FIG. 1 sectioned along Ia-Ia', Ib-Ib', II-II', and III-III'.

FIG. 3 is a cross-sectional view illustrating an a semiconductor device according to another example embodiment of inventive concepts. As is the case with FIG. 2, FIG. 3 shows cross-sectional views along Ia-Ia', Ib-Ib', and III-III' in FIG. 1. The example embodiment shown in FIG. 3 is similar to the example embodiment shown in FIG. 2. Therefore, the same components are referred to with the same numerals, and repetitive descriptions are omitted.

Referring to FIG. 3, a floating pattern 130a' includes a first portion 129a disposed between an e-fuse gate 150a and an e-fuse active portion ACT1. A pair of second portions 129b' extend upward along sidewalls of the e-fuse gate 150a from both edges of the first portion 129a. In this example embodiment, top surfaces of the second portions 129b' are disposed at a height lower than a top surface of the e-fuse gate 150a. That is for example, the top surfaces of the second portions 129W are recessed relative to the top surface of the e-fuse gate 150a. Therefore, a concave region is defined on the top surfaces of the second portions 129b'. The concave region may be filled with a gap-fill dielectric layer 152 formed of, for example, oxide, nitride, and/or oxynitride.

An interlayer dielectric 155 is disposed on the mold layer 123 and portions of the e-fuse structure exposed through the mold layer 123. At least a lower portion of the interlayer dielectric 155 may be formed of insulating diffusion barrier material (e.g., nitride and/or oxynitride).

According to at least this example embodiment, the gap-fill dielectric layer 152 may be omitted. In this case, a portion of the interlayer dielectric 155 may fill the concave region.

Although not shown, the interlayer dielectric 155 may also be disposed on the mold layer 123 of the semiconductor device illustrated in FIG. 2.

Because the top surfaces of the second portions 129W are disposed at a height lower than the top surface of the e-fuse gate 150a, insulating properties between the e-fuse gate 150a and the floating pattern 130a' may be improved.

A method for fabricating the semiconductor device including the e-fuse according to an example embodiment of inventive concepts will be described with regard to the drawings.

FIGS. 4A to 11A are planar views for explaining a method of fabricating a semiconductor device according to an example embodiment of inventive concepts.

FIGS. 4B to 11B are cross-sectional views taken along Ia-Ia', Ib-Ib', II-II', and III-III' corresponding to the planar views of FIGS. 4A to 11A.

Referring to FIGS. 4A and 4B, the substrate 100 including the first region 70, the second region 80, and the third region 90 is prepared. The device isolation pattern 101 is formed in the substrate 100 to define the e-fuse active portion ACT1 in the first region 70, the first MOS active portion ACT2 in the second region 80, and the second MOS active portion ACT3 in the third region 90.

The e-fuse dielectric layer 105a is formed on the first region 70 of the substrate 100. The first MOS gate dielectric layer 105b is formed on the second region 80 of the substrate 100. The second MOS gate dielectric layer 105c is formed on the third region 90 of the substrate 100. The e-fuse dielectric layer 105a, the first MOS gate dielectric layer 105b, and the second MOS gate dielectric layer 105c may be formed simultaneously or concurrently. Otherwise, the dielectric layers 105a, 105b and 105c may be formed sequentially regardless of order.

Thereafter, a dummy gate layer may be formed on the substrate 100. By sequentially patterning the dummy gate layer and the e-fuse dielectric layer 105a in the first region 70, the e-fuse dielectric layer 105a and a first dummy gate 110a are formed to be sequentially stacked on the e-fuse active portion ACT1. By sequentially patterning the dummy gate layer and the first MOS gate dielectric layer 105b in the second region 80, the first MOS gate dielectric layer 105b and a second dummy gate 110b are formed to be sequentially stacked on the first MOS active portion ACT2. By sequentially patterning the dummy gate layer and the second MOS gate dielectric layer 105c in the third region 90, the second MOS gate dielectric layer 105c and a third dummy gate 110c are formed to be sequentially stacked on the second MOS active portion ACT2. The first, second and third dummy gates 110a, 110b and 110c may be formed simultaneously or concurrently. As illustrated in FIG. 4A, the first dummy gate 110a crosses the e-fuse active portion ACT1; the second dummy gate 110b crosses the first MOS active portion ACT2; and the third dummy gate 110c crosses the second MOS active portion ACT3. According to at least this example embodiment, a width of the first dummy gate 110a is larger than that of the second dummy gate 110b. Also, the width of the first dummy gate 110a is larger than that of the third dummy gate 110c.

Figure 5A:
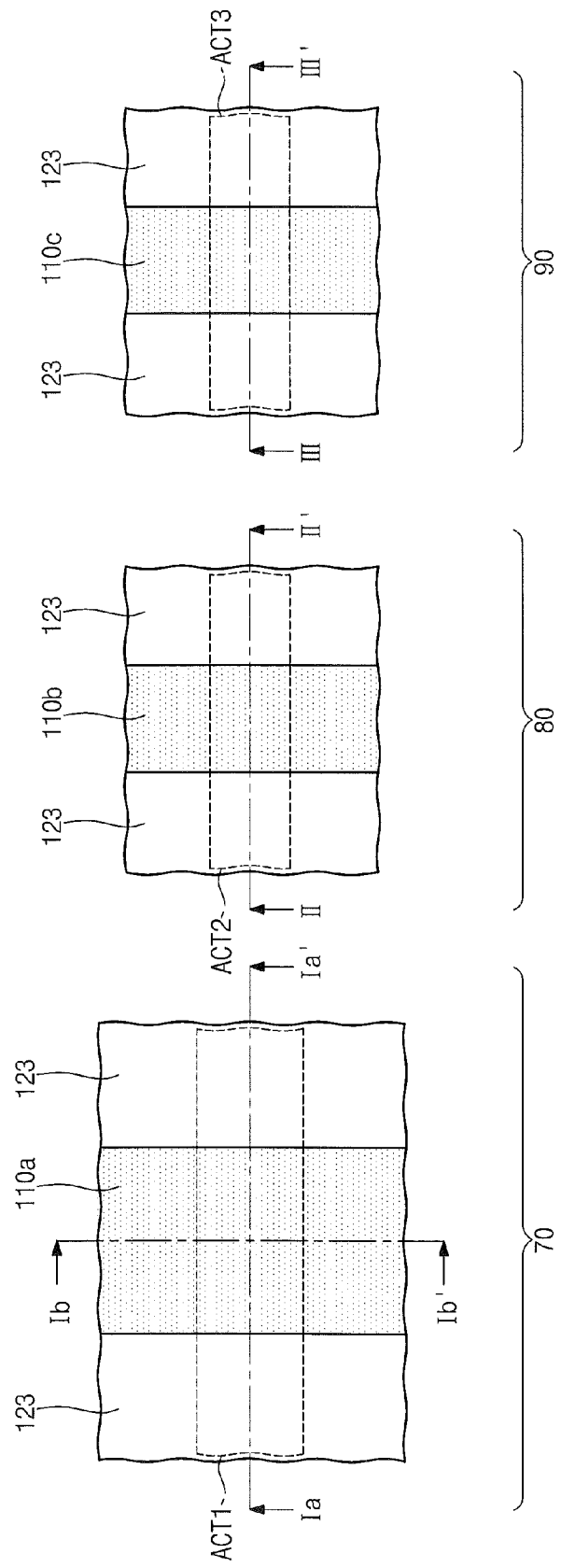
Figure 5B:
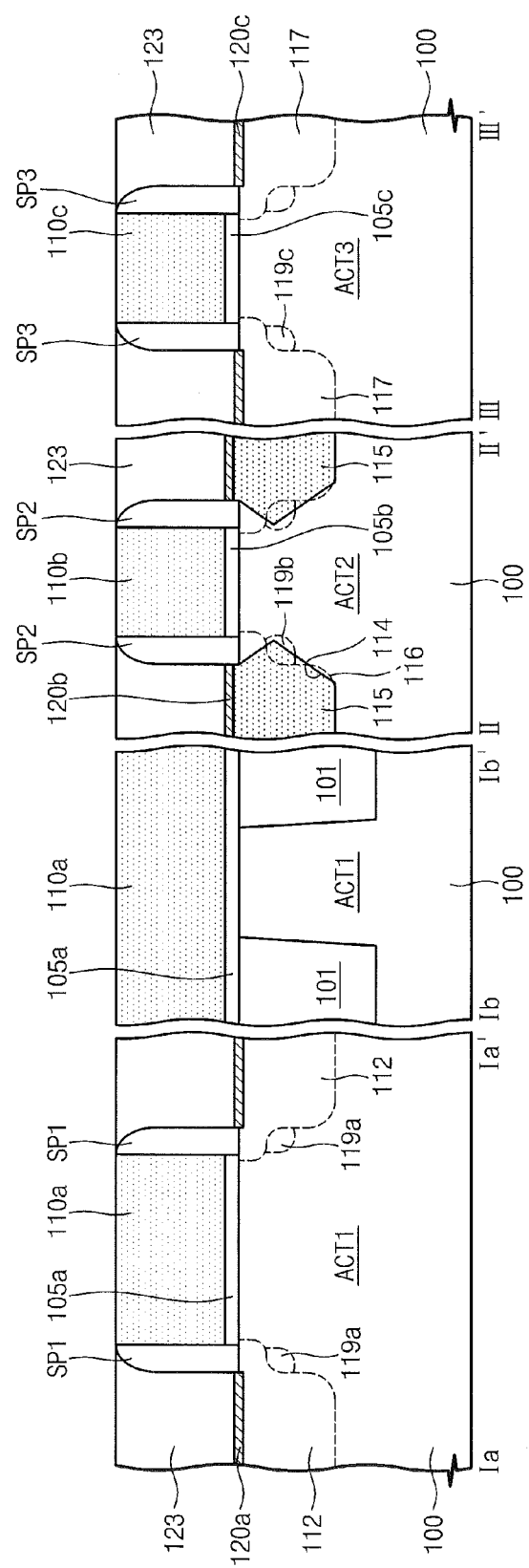

Referring to FIGS. 5A and 5B, the e-fuse source/drain 112 are formed in the e-fuse active portion ACT1 at either side of the first dummy gate 110a. The first MOS source/drain 116 are formed in the first MOS active portion ACT2 at either side of the second dummy gate 110b. The second MOS source/drain 117 are formed in the second MOS active portion ACT3 at either side of the third dummy gate 110c. One of the first MOS source/drain 116 and the second MOS source/drain 117 may be formed of an N-type dopant, whereas the other may be formed of a P-type dopant. The first MOS source/drain 116 and the second MOS source/drain 117 may be formed sequentially regardless of order. The e-fuse source/drain 112 may be formed of the same type of dopant as one of the first MOS source/drain 116 and the second MOS source/drain 117. The e-fuse source/drain 112 and the first or second MOS source/drain 116 or 117 doped with the same type of dopant may be formed simultaneously or concurrently. Otherwise, the e-fuse source/drain 112 and the first or second MOS source/drain 116 or 117 doped with the same type of dopant may be formed sequentially regardless of order. The e-fuse source/drain 112, the first MOS source/drain 116, and the second MOS source/drain 117 may be formed to be self-aligned with the dummy gates 110a, 110b and 110c.

The first, second and third insulation spacers SP1, SP2 and SP3 may be formed on the sidewalls of the first, second and third dummy gates 110a, 110b and 110c, respectively. If the e-fuse source/drain 112, the first MOS source/drain 116, and the second MOS source/drain 117 are formed as LDD structures, the e-fuse source/drain 112, the first MOS source/drain 116, and the second MOS source/drain 117 may be formed using the dummy gates 110a, 110b and 110c and the insulation spacers SP1, SP2 and SP3 as a mask. In this example, a relatively low dose of dopant ions may be injected before forming the insulation spacers SP1, SP2 and SP3, and a higher dose of dopant ions may be injected after forming the insulation spacers SP1, SP2 and SP3.

Still referring to FIGS. 5A and 5B, the recess regions 114 are formed by recessing the first MOS active portion ACT2 at both sides of the second dummy gate 110b and the second insulation spacer SP2. In this example, the e-fuse active portion ACT1 and the second MOS active portion ACT3 at respective sides of the first and third dummy gates 110a and 110c may be covered with a mask (e.g., oxide and nitride). The recess regions 114 may be formed using a selective wet etching process for selectively etching according to a crystal face. For the selective wet etching process, a group of crystal face $\{1, 1, 1\}$ of silicon may used as an etch stop surface. Therefore, as illustrated in FIG. 5B, the sidewall of the recess region 114 may be sharp-pointed (e.g., have a relatively sharp point) toward a portion under the second dummy gate 110b.

The semiconductor pattern 115 may be formed to fill the recess region 114. The semiconductor pattern 115 may be formed by a selective epitaxial growth process using a source gas including a semiconductor element different from that of the substrate 100. The semiconductor pattern 115 may be doped using an in-situ method. In this example, the entirety of the semiconductor pattern 115 may be included in the first MOS source/drain 116. Otherwise, after forming the semiconductor pattern 115, the first MOS source/drain 116 may be formed by injecting dopant ions into the first MOS active portion ACT2, which includes the semiconductor pattern 115 using the second dummy gate 110b and the insulation spacer SP1 as a mask.

After forming the dummy gates 110a, 110b and 110c, the insulation spacers SP1, SP2 and SP3, and the semiconductor pattern 115, the top surfaces of the sources/drains 112, 116, and 117 are exposed. Thereafter, the first, second and third metal-semiconductor compound layers 120a, 120b and 120c are formed by reacting the exposed top surfaces of the sources/drains 112, 116, and 117 with metal.

A mold layer is formed on the substrate 100, and the mold layer is planarized to expose the dummy gates 110a, 110b and 110c. The planarized mold layer 123 is coplanar or substantially coplanar with the top surfaces of the dummy gates 110a, 110b and 110c. The mold layer 123 may be formed of a dielectric material having an etch selectivity for the dummy gates 110a, 110b and 110c. In addition, the insulation spacers SP1, SP2 and SP3 may also include the dielectric material having an etch selectivity for the dummy gates 110a, 110b and 110c. In one example, the dummy gates 110a, 110b and 110c may be formed of a poly-crystal semiconductor and the mold layer 123 may be formed of oxide, nitride, and/or oxynitride. Also, the insulation spacers SP1, SP2 and SP3 may be formed of oxide, nitride, and/or oxynitride.

Figure 6B:
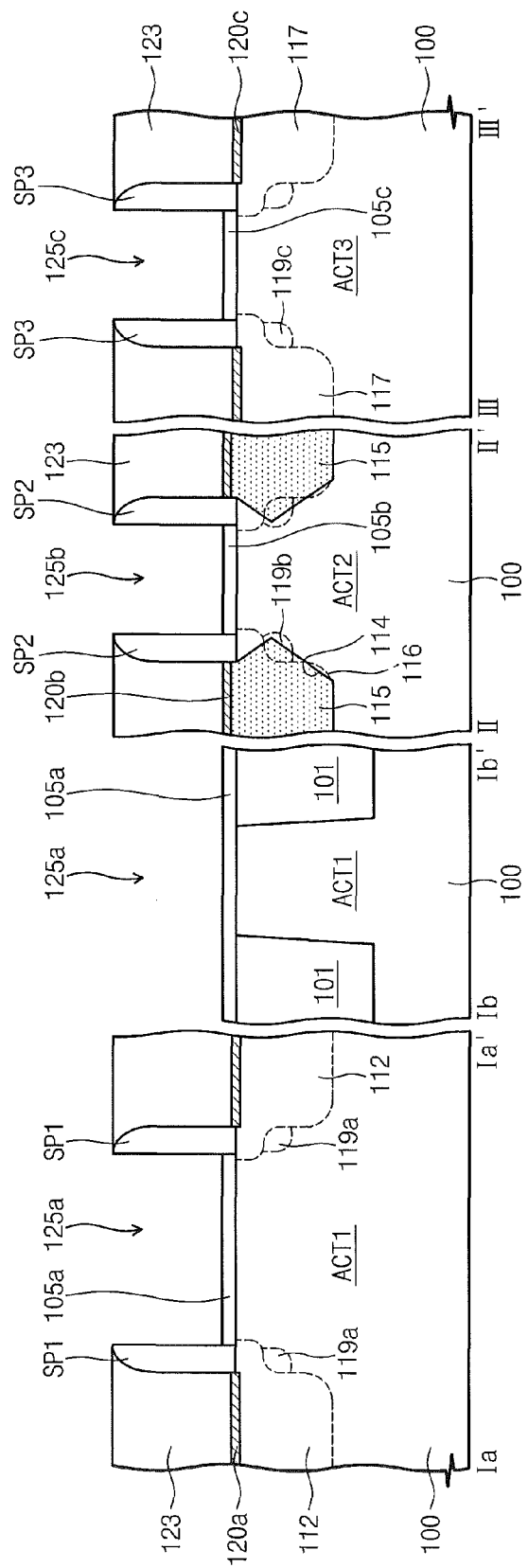

Referring to FIGS. 6A and 6B, the grooves 125a, 125b and 125c are formed by removing the exposed dummy gates 110a, 110b and 110c. The first dummy gate 110a is removed so that the first groove 125a is formed in the first region 70; the second dummy gate 110b is removed so that the second groove 125b is formed in the second region 80; and the third dummy gate 110c is removed so that the third groove 125c is formed in the third region 90. As shown, the e-fuse dielectric layer 105a, the first MOS gate dielectric layer 105b, and the second MOS gate dielectric layer 105c remain, and thus, are exposed by the first, second and third grooves 125a, 125b and 125c, respectively.

Although not illustrated, according to at least this example embodiment, the dielectric layers 105a, 105b and 105c may be formed after forming the grooves 125a, 125b and 125c. In more detail, the dummy gates 110a, 110b and 110c may be removed to form the first, second and third grooves 125a, 125b and 125c and expose the e-fuse active portion ACT1, the first MOS active portion ACT2, and the second MOS active portion ACT3. Thereafter, the e-fuse dielectric layer 105a, the first MOS gate dielectric layer 105b, and the second MOS gate dielectric layer 105c may be formed on the exposed portions of the e-fuse active portion ACT1, the first MOS active portion ACT2, and the second MOS active portion ACT3, respectively.

According to at least this example embodiment, the width of the first groove 125a may be larger than that of the second groove 125b. Also, the width of the first groove 125a may be larger than that of the third groove 125c. However, inventive concepts are not limited thereto. The widths of the dummy gates 110a, 110b and 110c may be adjusted so that the widths of the dummy gates 110a, 110b and 110c may be the same, substantially the same or different from each other.

Figure 7B:
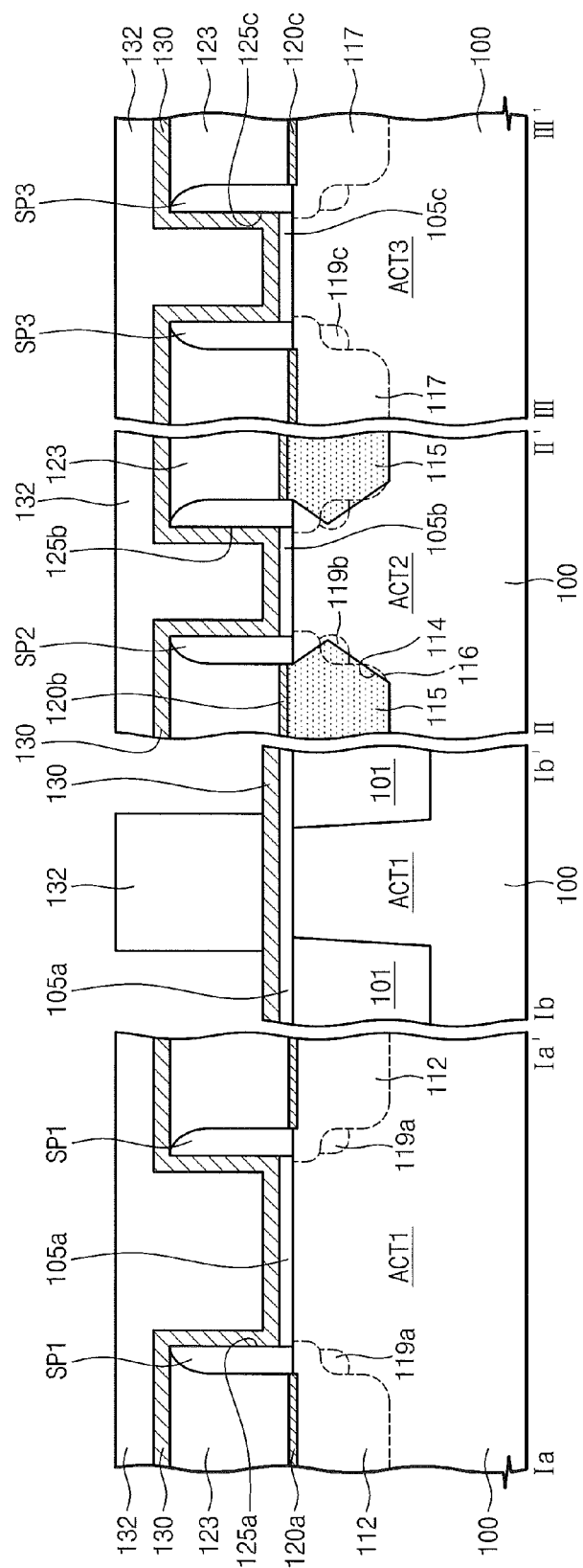

Referring to FIGS. 7A and 7B, a first conductive layer 130 is formed (e.g., conformally formed) on the substrate 100 having the grooves 125a, 125b and 125c. Therefore, the first conductive layer 130 is formed along inner surfaces of the grooves 125a, 125b and 125c and a top surface of the mold layer 123. The inner surfaces of the grooves 125a, 125b and 125c include inner sidewalls and bottom surfaces of the grooves 125a, 125b and 125c. The first conductive layer 130 may have a single-layer or multi-layer structure. In one example, the first conductive layer 130 may include a metallic conductive material.

A mask pattern 132 is formed on the first conductive layer 130. The mask pattern 132 covers the first conductive layer 130 in the second and third regions 80 and 90. The mask pattern 132 also covers the first conductive layer 130 on the e-fuse active portion ACT1 of the first region 70. Herein, at least the first conductive layer 130 disposed on the device isolation pattern 101 of both sides of the e-fuse active portion ACT1 and disposed on the inner surface of the first groove 125a is exposed. The inner surface of the first groove 125a includes the bottom surface and both inner sidewalls of the first groove 125a. As illustrated in FIG. 7A, the first conductive layer 130 disposed on the device isolation pattern 101 in the first region 70 and disposed on the top surface of the mold layer 123 is also exposed. Herein, the first conductive layer 130 disposed on the e-fuse active portion ACT1 and disposed on the top surface of the mold layer 123 is covered with the mask pattern 132. The mask pattern 132 may be formed of, for example, oxynitride, nitride, oxide, and/or photoresist.

Figure 8A:
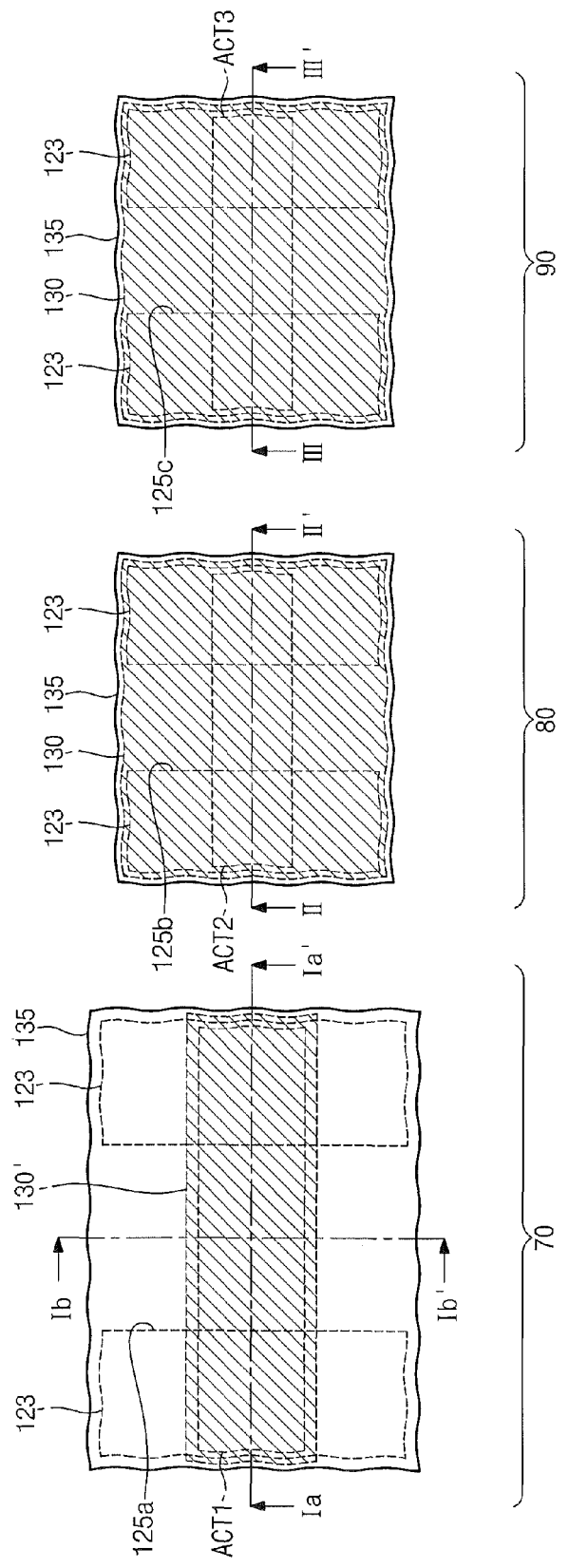
Figure 8B:
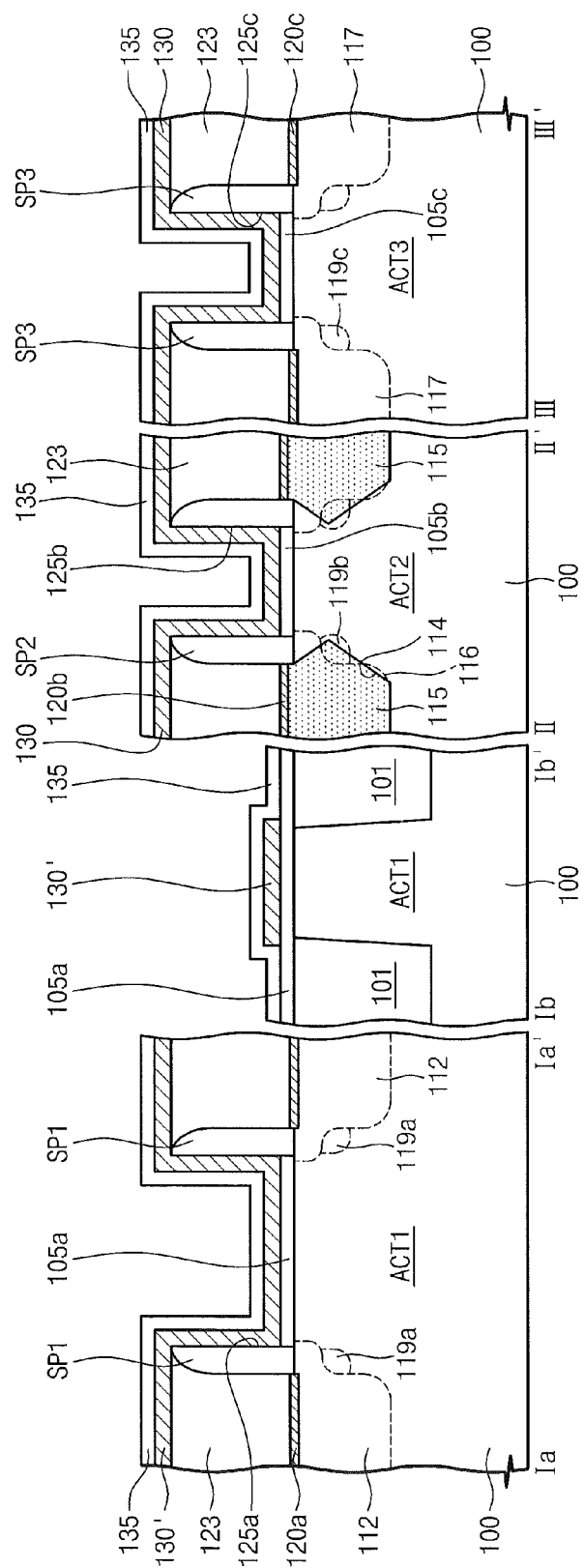

Referring to FIGS. 8A and 8B, the exposed first conductive layer 130 is removed using the mask pattern 132 as an etch mask. Therefore, a first conductive layer 130' under the mask pattern 132 remains in the first region 70. The first conductive layer 130' remaining in the first region 70 is disposed on the e-fuse active portion ACT1. The first conductive layer 130 in the first and second regions 80 and 90 is not exposed, and thus, remains. In one example, the exposed first conductive layer 130 may be removed by an isotropic etching process (e.g., wet etching process and/or dry isotropic etching process).

Thereafter, the mask pattern 132 is removed, and the blocking dielectric layer 135 is formed (e.g., conformally formed) on the substrate 100. In more detail, the blocking dielectric layer 135 is formed on the remaining first conductive layer 130' and 130 and formed along the inner surfaces of the grooves 125a, 125b and 125c and the top surface of the mold layer 123. The blocking dielectric layer 135 may be formed of oxide, oxynitride, and/or high-k dielectric material (e.g., metal oxide such as hafnium oxide or aluminum oxide).

Figure 9A:
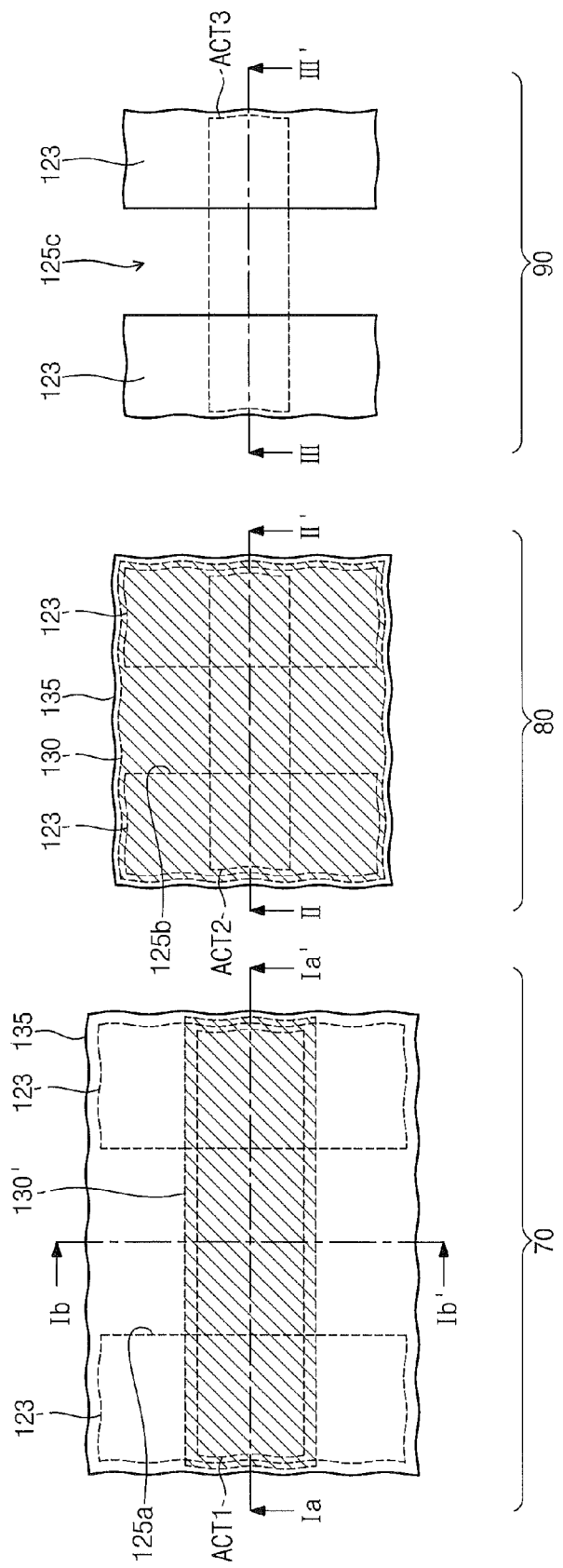
Figure 9B:
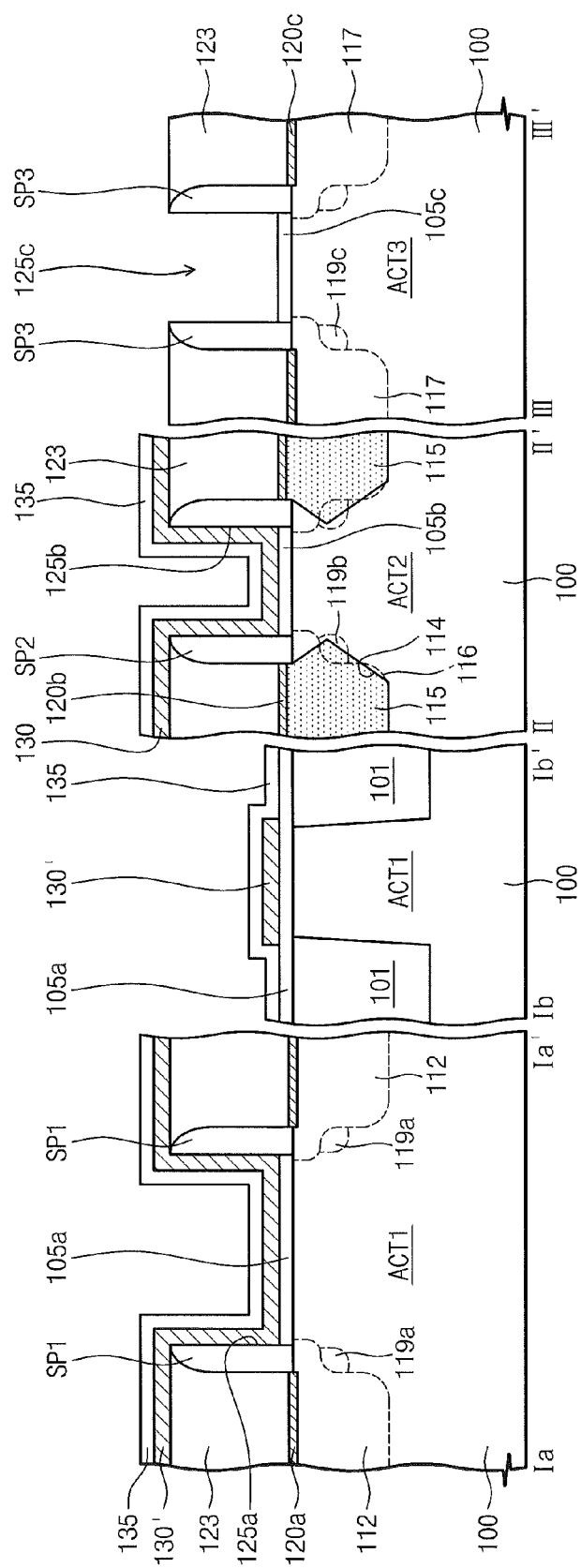

Referring to FIGS. 9A and 9B, the blocking dielectric layer 135 and the first conductive layer 130 in the third region 90 are removed to expose the inner surface of the third groove 125c and the mold layer 123. The second MOS gate dielectric layer 105c is also exposed. The blocking dielectric layer 135 and the first conductive layer 130' in the first region 70 and the blocking dielectric layer 135 and the first conductive layer 130 in the second region 80 remain. A second mask pattern (not illustrated) covering the blocking dielectric layer 135 in the first and second regions 70 and 80 is formed, and the blocking dielectric layer 135 and the first conductive layer 130 in the third region 90 are removed using the second mask pattern as an etch mask. The blocking dielectric layer 135 and the first conductive layer in the third region 90 may be removed by an isotropic etching process (e.g., wet etching process and/or dry isotropic etching process).

Figure 10A:
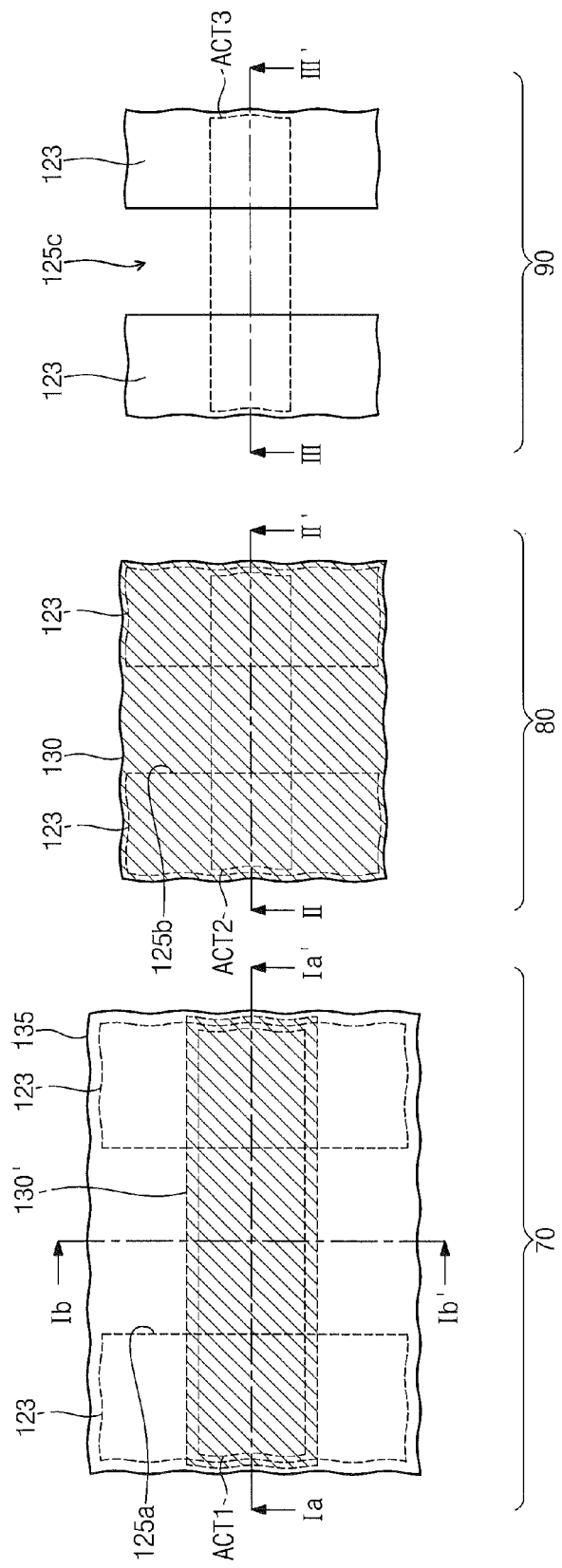
Figure 10B:
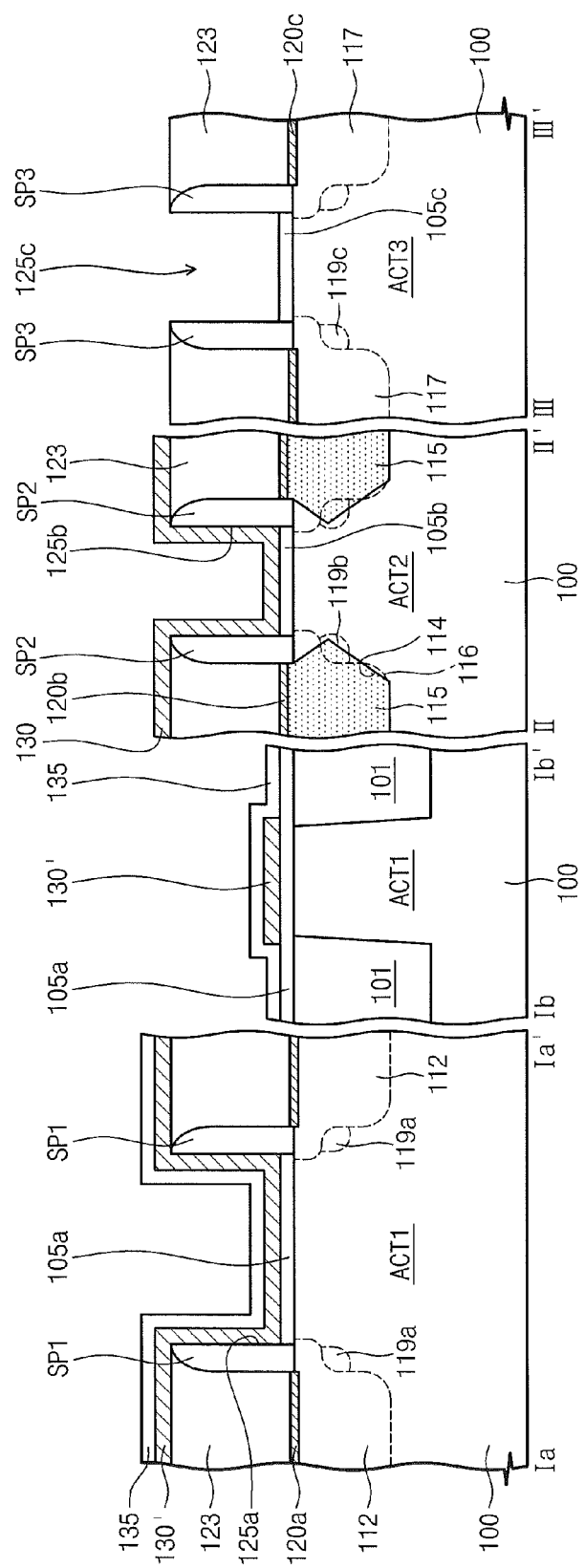

Referring to FIGS. 10A and 10B, the first conductive layer 130 in the second region 80 is exposed by removing the blocking dielectric layer 135 in the second region 80. However, the blocking dielectric layer 135 in the first region 70 remains. In one example, a third mask pattern (not illustrated) covering the first and third regions 70 and 90 may be formed, and the blocking dielectric layer 135 in the second region 80 may be removed using the third mask pattern as an etch mask.

Figure 11A:
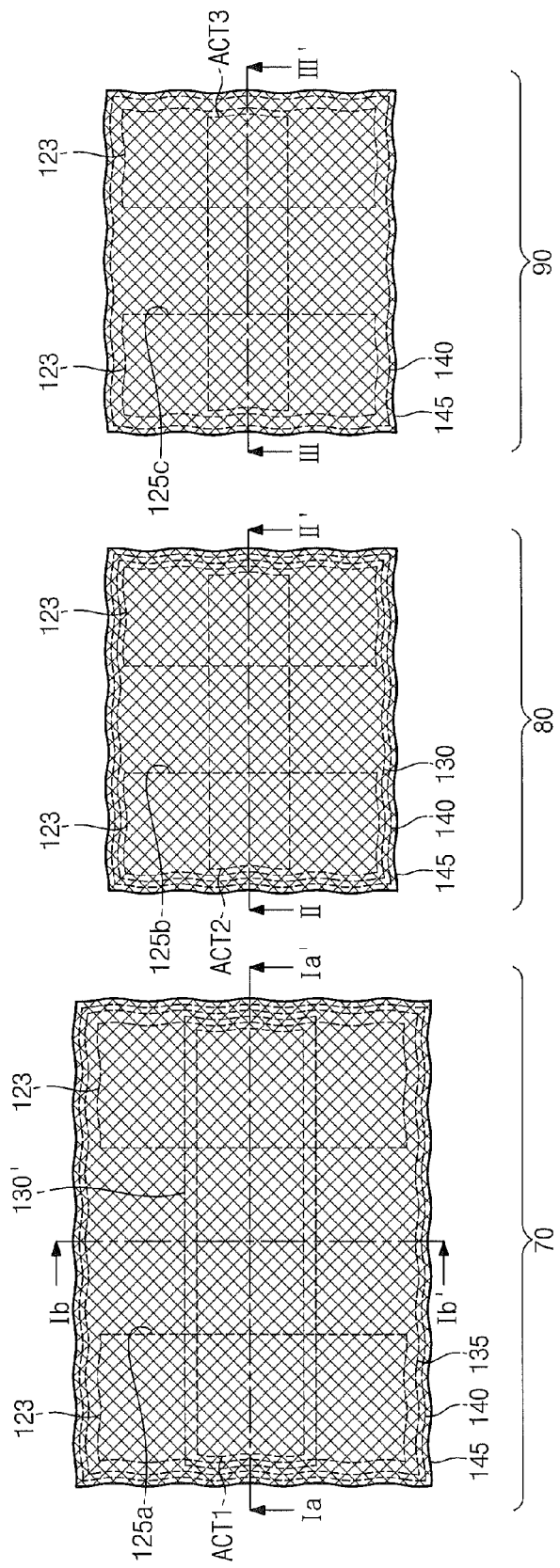
Figure 11B:
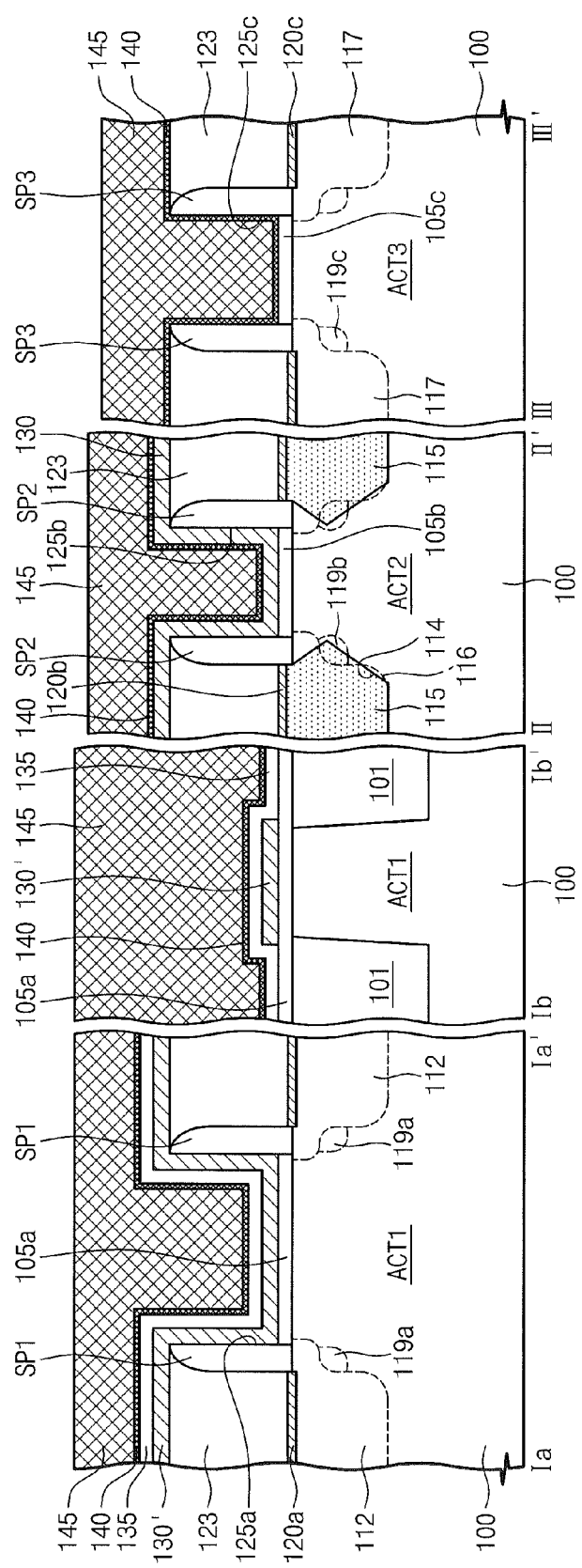

Referring to FIGS. 11A and 11B, a second conductive layer 140 is formed (e.g., conformally formed) on the substrate 100. In the first region 70, the second conductive layer 140 is conformally formed along a surface of the blocking dielectric layer 135. More specifically, the second conductive layer 140 in the first region 70 is conformally formed along the inner surface of the first groove 125a and the top surface of the mold layer 123.

The second conductive layer 140 is conformally formed along a surface of the first conductive layer 130 in the second region 80. According to at least this example embodiment, the second conductive layer 140 in the second region 80 contacts the first conductive layer 130. In more detail, the second conductive layer 140 in the second region 80 is conformally formed along the inner surface of the second groove 125b and the top surface of the mold layer 123.

The second conductive layer 140 is also conformally formed along the inner surface of the third groove 125c and the top surface of the mold layer 123 in the third region 90. The second conductive layer 140 in the third region 90 contacts the second MOS gate dielectric layer 105c.

The second conductive layer 140 may include a metallic conductive material. And, the second conductive layer 140 may have a single-layer or multi-layer structure.

Thereafter, a third conductive layer 145 is formed on the second conductive layer 140. The third conductive layer 145 fills the first, second and third grooves 125a, 125b and 125c. The third conductive layer 145 contacts the second conductive layer 140. According to at least this example embodiment, a first coupling-work function generated by coupling of the first, second and third conductive layers 130, 140, and 145 sequentially stacked in the second region 80 is different from a second coupling-work function generated by coupling of the second and third conductive layers 140 and 145 sequentially stacked in the third region 90. More particularly, for example, a work function of the first conductive layer 130 is different from the second coupling-work function. According to at least this example embodiment, the first conductive layer 130 may be thicker than the second conductive layer 140.

According to at least one example embodiment, a PMOS transistor is formed in the second region 80 and an NMOS transistor is formed in the third region 90. In this example, the first conductive layer 130 may include relatively high work function-metal nitride. Herein, the second and third conductive layers 140 and 145 may be composed for the second coupling-work function to have a relatively low work function. For example, the second conductive layer 140 may include conductive metal nitride having a relatively thin thickness, and the third conductive layer 145 may include metal having a relatively low work function. Otherwise, the second conductive layer 140 may include relatively low work function-metal nitride and be sufficiently thick. The relatively high work function-metal nitride and the relatively low work function-metal nitride may be the same or substantially the same as those described above referring to FIGS. 1 and 2.

According to at least one example embodiment, an NMOS transistor may be formed in the second region 80 and a PMOS transistor may be formed in the third region 90. In this example, the first conductive layer 130 includes the relatively low work function-metal nitride. The second and third conductive layers 140 and 145 may be composed for the second coupling-work function to have a relatively high work function. For example, the second conductive layer 140 may include conductive metal nitride having a relatively thin thickness, and the third conductive layer 145 may include metal having a relatively high work function. Otherwise, the second conductive layer 140 may include relatively high work function-metal nitride and be sufficiently thick.

Thereafter, the third conductive layer 145, the second conductive layer 140, the blocking dielectric layer 135, and the first conducive layer 130 and 130' are planarized until the top surface of the mold layer 123 is exposed. By the planarization, the floating pattern 130a, the blocking dielectric pattern 135a, and the e-fuse gate 150a illustrated in FIGS. 1 and 2 are formed in the first groove 125a. Also, the first MOS gate 150b illustrated in FIGS. 1 and 2 is formed in the second groove 125b and the second MOS gate 150c illustrated in FIGS. 1 and 2 is formed in the third groove 125c.

Referring back to FIGS. 11A, 11B, 1, and 2, the floating pattern 130a and the first sub-gate 130b of the first MOS gate 150b are formed from the first conductive layer 130' in the first region 70 and the first conductive layer 130 in the second region 80, respectively. The first sub-gate 140a of the e-fuse gate 150a, the second sub-gate 140b of the first MOS gate 150b, and the first sub-gate 140c of the second MOS gate 150c are formed from the second conductive layer 140. The second sub-gate 145a of the e-fuse gate 150a, the third sub-gate 145b of the first MOS gate 150b, and the second sub-gate 145c of the second MOS gate 150c are formed from the third conductive layer 145.

An example embodiment of a method of fabricating the semiconductor device illustrated in FIG. 3 may be similar to the fabricating method described with regard to FIGS. 4A to 11A and 4B to 11B. However, after performing the planarization, the top surfaces of the second portions 129b of the floating pattern 130a are selectively recessed. In this example, the top surfaces of the gates 150a, 150b and 150c may be protected by a mask pattern (not illustrated). Thereafter, as shown in FIG. 3, the gap-fill dielectric layer 152 is formed to fill the concave region on the recessed second portions 129b'.

After forming the gap-fill dielectric layer 152, the gap-fill dielectric layer 152 is planarized until the mold layer 123 is exposed thereby confining the gap-fill dielectric layer 152 within the concave region. Thereafter, the interlayer dielectric 155 is formed over the substrate 100. According to at least some example embodiments, the gap-fill dielectric layer 152 may be omitted, and the interlayer dielectric may fill the concave region.

Semiconductor devices according to example embodiments may be mounted in various types of packages. Examples packages of semiconductor devices include: Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP). Packages in which semiconductor devices according to example embodiments of inventive concepts may be mounted may further include other types of semiconductor devices (e.g., memory devices and/or logic devices) organically connected to the semiconductor device according to example embodiments of inventive concepts.

As described above, a floating pattern includes the first portion formed between the e-fuse gate and the e-fuse active portion, and second portions extending upwards along the sidewalls of the e-fuse gate from the edges of the first portion. The e-fuse structure may be electrically programmed by storing charges in the floating pattern. Also, because the floating pattern structurally floats, the size of the e-fuse structure including the floating pattern may be reduced. Therefore, semiconductor devices including the e-fuse structure for improved high-integration may be implemented.

Also, because the e-fuse gate is programmed by supplying the program voltage, the program operation of the e-fuse structure may be simplified. Also, additional, relatively high-priced program equipment is not needed. Therefore, the program efficiency of the e-fuse structure may be improved.

The above-disclosed subject matter is to be considered illustrative and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A semiconductor device, comprising:
    an e-fuse gate crossing over an e-fuse active portion of a substrate;
    a floating pattern including a first portion between the e-fuse gate and the e-fuse active portion, and a pair of second portions extending upward along sidewalls of the e-fuse gate;
    a blocking dielectric pattern between the floating pattern and the e-fuse gate; and
    an e-fuse dielectric layer between the floating pattern and the e-fuse active portion.

2. The semiconductor device of claim 1, wherein the floating pattern comprises:
    a metallic conductive material having a work function different from that of the e-fuse gate.

3. The semiconductor device of claim 1, wherein top surfaces of the pair of second portions of the floating pattern are substantially coplanar with a top surface of the e-fuse gate.

4. The semiconductor device of claim 1, wherein top surfaces of the pair of second portions of the floating pattern are disposed at a height lower than a top surface of the e-fuse gate.

5. The semiconductor device of claim 1, wherein the substrate includes a first region, a second region, and a third region separated from one another, and wherein the e-fuse active portion is defined in the first region, the semiconductor device further including,
    a first MOS gate dielectric layer and a first MOS gate stacked sequentially on a first MOS active portion defined in the second region of the substrate, and
    a second MOS gate dielectric layer and a second MOS gate stacked sequentially on a second MOS active portion defined in the third region of the substrate.

6. The semiconductor device of claim 5, wherein a work function of the first MOS gate is different from a work function of the second MOS gate.

7. The semiconductor device of claim 6, wherein the first MOS gate includes a first sub-gate, a second sub-gate and a third sub-gate that are sequentially stacked, the work function of the first MOS gate being a first coupling-work function generated by coupling of the first, second and third sub-gates of the first MOS gate, and wherein the second MOS gate includes a first sub-gate and a second sub-gate that are sequentially stacked, the work function of the second MOS gate being a second coupling-work function generated by coupling of the first and second sub-gates of the second MOS gate.

8. The semiconductor device of claim 7, wherein the first sub-gate of the first MOS gate has a work function different from the second coupling-work function, the floating pattern has the same work function as the first sub-gate of the first MOS gate, and a work function of the e-fuse gate is the same as the second coupling-work function.

9. The semiconductor device of claim 7, wherein the e-fuse gate includes a first sub-gate and a second sub-gate that are sequentially stacked, and wherein the first sub-gate of the e-fuse gate, the first and second sub-gates of the first MOS gate, and the first sub-gate of the second MOS gate serve as diffusion barriers with respect to corresponding metal elements.

10. The semiconductor device of claim 7, wherein the floating pattern is formed of a same material as the first sub-gate of the first MOS gate, the second sub-gate of the first MOS gate is formed of a same material as the first sub-gate of the second MOS gate, the third sub-gate of the first MOS gate is formed of a same material as the second sub-gate of the second MOS gate, and the e-fuse gate is formed of a same material as the second MOS gate.

11. The semiconductor device of claim 7, wherein the first sub-gate of the first MOS gate is thicker than the first sub-gate of the second MOS gate.

12. The semiconductor device of claim 7, wherein the first and second sub-gates of the first MOS gate cover a bottom surface and sidewalls of the third sub-gate of the first MOS gate, and the first sub-gate of the second MOS gate covers a bottom surface and sidewalls of the second sub-gate of the second MOS gate.

13. The semiconductor device of claim 5, further comprising:
    a mold layer disposed on the substrate; wherein
        the e-fuse gate, the blocking dielectric pattern and the floating pattern are disposed in a first groove defined in a portion of the mold layer corresponding to the first region of the substrate,
        the first MOS gate is disposed in a second groove defined in a portion of the mold layer corresponding to the second region of the substrate, and
        the second MOS gate is disposed in a third groove defined in a portion of the mold layer corresponding to the third region of the substrate.

14. The semiconductor device of claim 13, further comprising:
    a first insulation spacer between the mold layer and each second portion of the floating pattern;
    a second insulation spacer between the mold layer and sidewalls of the first MOS gate; and
    a third insulation spacer between the mold layer and sidewalls of the second MOS gate; wherein
        an inner sidewall of the first groove is defined by the first insulation spacer,
        an inner sidewall of the second groove is defined by the second insulation spacer, and
        an inner sidewall of the third groove is defined by the third insulation spacer.

15. The semiconductor device of claim 5, wherein a horizontal distance between outer sidewalls of the pair of the second portions of the floating pattern is larger than a width of the first MOS gate.

16. The semiconductor device of claim 5, further comprising:

an e-fuse source/drain formed in the e-fuse active portion at both sides of the floating pattern;
a first MOS source/drain formed in the first MOS active portion at both sides of the first MOS gate; and
a second MOS source/drain formed in the second MOS active portion at both sides of the second MOS gate;
wherein
one of the first MOS source/drain and the second MOS source/drain is doped with an N-type dopant and an other of the first MOS source/drain and the second MOS source/drain is doped with a P-type dopant, and
the e-fuse source/drain is doped with a same type of dopant as one of the first MOS source/drain and the second MOS source/drain.

17. The semiconductor device of claim 1, wherein the e-fuse dielectric layer is a high-k dielectric material having a dielectric constant greater than that of a silicon oxide layer.

* * * * *

UNITED STATES PATENT AND TRADEMARK OFFICE
CERTIFICATE OF CORRECTION

PATENT NO. : 8,426,943 B2
APPLICATION NO. : 13/094045
DATED : April 23, 2013
INVENTOR(S) : Deok-Kee Kim It is certified that error appears in the above-identified patent and that said Letters Patent is hereby corrected as shown below:

On the Title page, Item (54) and in the Specification, Column 1, Title should read as follows:

--SEMICONDUCTOR DEVICES HAVING E-FUSE STRUCTURES
AND METHODS OF FABRICATING THE SAME--

Signed and Sealed this
Sixteenth Day of July, 2013

Teresa Stanek Rea
*Acting Director of the United States Patent and Trademark Office*